United States Patent
Liu

(10) Patent No.: US 9,431,257 B2
(45) Date of Patent: Aug. 30, 2016

(54) SALICIDED STRUCTURE TO INTEGRATE A FLASH MEMORY DEVICE WITH A HIGH κ, METAL GATE LOGIC DEVICE

(71) Applicant: Taiwan Semiconductor Manufacturing Co., Ltd., Hsin-Chu (TW)

(72) Inventor: Ming Chyi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 42 days.

(21) Appl. No.: 14/330,120

(22) Filed: Jul. 14, 2014

(65) Prior Publication Data

US 2016/0013197 A1   Jan. 14, 2016

(51) Int. Cl.
| H01L 27/115 | (2006.01) |
| H01L 21/28 | (2006.01) |
| H01L 29/423 | (2006.01) |
| H01L 29/66 | (2006.01) |
| H01L 29/792 | (2006.01) |

(52) U.S. Cl.
CPC ..... *H01L 21/28282* (2013.01); *H01L 27/1157* (2013.01); *H01L 27/11529* (2013.01); *H01L 27/11573* (2013.01); *H01L 29/42344* (2013.01); *H01L 29/66833* (2013.01); *H01L 29/792* (2013.01)

(58) Field of Classification Search
CPC ................................................ H01L 27/11536
See application file for complete search history.

(56) References Cited

U.S. PATENT DOCUMENTS

| 8,173,505 B2 * | 5/2012 | Herrick | B82Y 10/00 257/E21.422 |
| 2013/0267072 A1 * | 10/2013 | Hall | H01L 21/82 438/258 |
| 2014/0227843 A1 * | 8/2014 | Tsukamoto | H01L 29/6659 438/275 |
| 2014/0239377 A1 * | 8/2014 | Nishida | H01L 29/792 257/324 |
| 2015/0333082 A1 * | 11/2015 | Chuang | H01L 27/11573 257/326 |

* cited by examiner

*Primary Examiner* — Stephen W Smoot
(74) *Attorney, Agent, or Firm* — Eschweiler & Associates, LLC

(57) ABSTRACT

An integrated circuit for an embedded flash memory device is provided. A semiconductor substrate includes a memory region and a logic region adjacent to the memory region. A logic device is arranged over the logic region and includes a metal gate separated from the semiconductor substrate by a material having a dielectric constant exceeding 3.9. A flash memory cell device is arranged over the memory region. The flash memory cell device includes a first memory cell gate, a second memory cell gate, and a dielectric region arranged between neighboring sidewalls of the first and second memory cell gates. A silicide contact pad is arranged over a top surface of the first memory cell gate. The silicide contact pad is recessed relative to top surfaces of the dielectric region, the second memory cell gate and the metal gate. A method of manufacturing the integrated circuit is also provided.

20 Claims, 27 Drawing Sheets ic Structure to Integrate a Flash Memory Device with a High κ, Metal Gate Logic Device

BACKGROUND

The semiconductor manufacturing industry has experienced exponential growth over the last few decades. In the course of semiconductor evolution, functional density (i.e., the number of interconnected devices per chip area) has generally increased while geometry size (i.e., the smallest component or line that can be created using a fabrication process) has generally decreased. One advancement has been the development of semiconductor devices, such as transistors, employing metal gates insulated by materials having a high dielectric constant (κ). Such semiconductor devices have improved performance with decreased feature sizes, relative to traditional polysilicon gates insulated by silicon dioxide.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
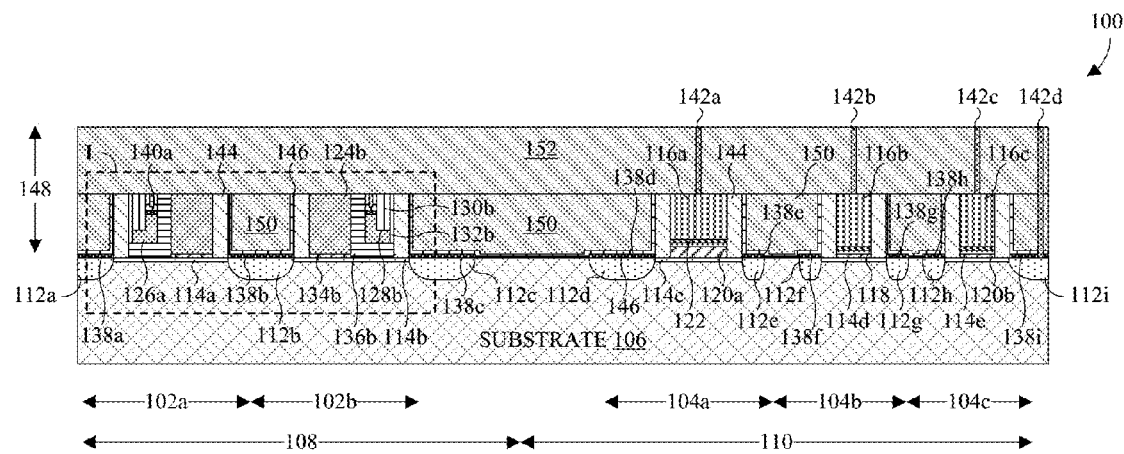
FIG. 1A illustrates a cross-sectional view of some embodiments of a semiconductor structure with memory cell devices and high κ, metal gate logic devices, the memory cell devices including silicided structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different semiconductor components of a composite semiconductor device into a common semiconductor structure. Such integration advantageously allows lower manufacturing costs, simplified manufacturing procedures, and increased operational speed. One type of composite semiconductor device often integrated into a common semiconductor structure is a flash memory device. A flash memory device includes an array of flash memory cell devices and logic devices supporting operation of the flash memory cell devices. When the array of flash memory cell devices and the logic devices are integrated into a common semiconductor structure, the flash memory device is often referred to as an embedded flash memory device.

Common types of flash memory cell devices include stacked gate flash memory cell devices and split gate flash memory cell devices. Split gate flash memory cell devices have several advantages over stacked gate flash memory cell devices, such as lower power consumption, higher injection efficiency, less susceptibility to short channel effects, and over erase immunity. Examples of split gate flash memory cell devices include silicon-oxide-nitride-oxide-silicon (SONOS) split gate flash memory cell devices, metal-oxide-nitride-oxide-silicon (MONOS) split gate flash memory cell devices, and third generation SUPERFLASH (ESF3) memory cell devices.

Embedded flash memory devices include flash memory cells, which are typically formed with polysilicon gates insulated by silicon dioxide, as well as logic devices, such as, for example, address decoders or read/write circuitry. However, as semiconductor feature sizes get smaller and smaller, the logic devices of such embedded flash memory devices are reaching performance limits. High κ metal gate (HKMG) technology has become one of the front runners for the logic devices in the next generation of embedded flash memory devices. HKMG technology employs a metal gate separated from the underlying substrate by a material with a high dielectric constant κ (relative to silicon dioxide). The high κ dielectric reduces leakage current and increases the maximum drain current, and the metal gate mitigates the effects of fermi-level pinning and allows the gate to be employed at lower threshold voltages. Further, the high κ dielectric and the metal gate collectively reduce power consumption.

In forming an embedded flash memory device employing HKMG technology according to some methods, the flash memory cell devices are formed with polysilicon gates. Subsequently, the logic devices are formed with sacrificial gates insulated by a high κ dielectric. With the flash memory cell devices and the logic devices formed, silicide is formed over the source/drain regions. The silicide advantageously reduces the resistance between the source/drain regions and subsequently formed contacts. Further, an interlayer dielectric structure covering the logic and memory cell devices is formed and a first planarization is performed into the interlayer dielectric structure to the polysilicon gates. Subsequent to the first planarization, the sacrificial gates of the logic devices are replaced with metal gates, while leaving the polysilicon gates of the flash memory cell devices. This includes removing the sacrificial gates to form recesses, filling the recesses with a metal layer, and performing a second planarization into the metal layer to form metal gates co-planar with the polysilicon gates. Ideally, the silicide would be formed over the polysilicon gates with the source/drain regions to reduce contact resistance. However, metal contamination may occur during the first planarization. Further, regardless of the metal contamination, the second planarization would remove the silicide over the polysilicon gates during a 28 nanometer (nm) manufacture. Hence, HKMG technology is incompatible with forming the silicide over the polysilicon gates according to the foregoing methods during a 28 nm manufacture.

In view of the foregoing, the present disclosure is directed to an improved method to integrating a flash memory device with a high κ, metal gate logic device, as well as the resulting semiconductor structure. The improved method forms a memory cell device with a first gate and a second gate neighboring the first gate. Thereafter, a top surface of the first gate is recessed relative to a top surface of the second gate, and silicide is formed over the recessed top surface of the first gate. The top surface of the first gate is recessed far enough below the first and second planarizations so that the silicide persists after the first and second planarizations. The improved method and semiconductor structure advantageously prevent metal contamination during the first planarization. Further, the improved method and semiconductor structure reduce resistivity between the first gate and a subsequently formed contact.

Figure 1B:
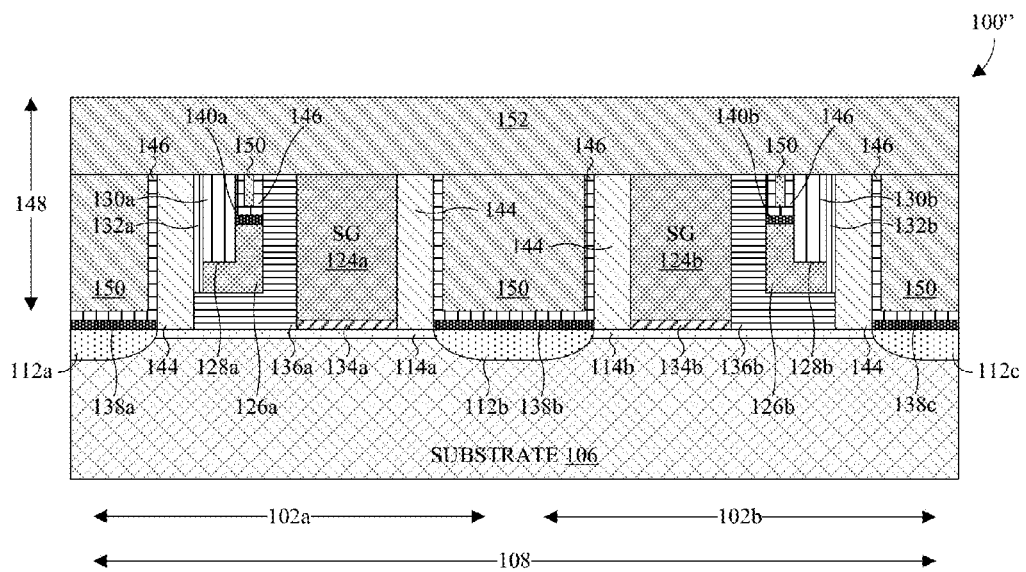
FIG. 1B illustrates a cross-sectional view of some embodiments of the semiconductor structure within box I of FIG. 1A.

With reference to FIGS. 1A & B, cross-sectional views 100', 100'' of some embodiments of a semiconductor structure (e.g., representing an integrated circuit) with memory cell devices 102a, 102b and high κ, metal gate logic devices 104a-c are provided. FIG. 1A provides a cross-sectional view 100' with both the memory cell devices 102 and the logic devices 104, and FIG. 1B provides an enlarged cross-sectional view 100'' of the memory cell devices 102 within box I of FIG. 1A. The memory cell devices 102 include a first memory cell device 102a and a second memory cell device 102b. The memory cell devices 102 store data in a nonvolatile manner and are, for example, MONOS or SONOS split gate flash memory cell devices. The logic devices 104 include a first logic device 104a, a second logic device 104b, and a third logic device 104c. The logic devices 104 coordinate to implement logic supporting operation of the memory cell devices 102 and are, for example, transistors.

The memory cell devices 102 and the logic devices 104 are formed over and/or within a semiconductor substrate 106. The memory cell devices 102 are localized to a memory region 108 of the semiconductor substrate 106, and the logic devices 104 are localized to a logic region 110 of the semiconductor substrate 106 that is typically arranged around the periphery of the memory region 108. The semiconductor substrate 106 is, for example, a bulk substrate of silicon, germanium, or group III and group V elements. Alternatively, the semiconductor substrate 106 is, for example, a semiconductor-on-insulator (SOI) substrate.

Embedded within the top surface of the semiconductor substrate 106, the semiconductor substrate 106 includes source/drain regions 112a-i. The source/drain regions 112 are spaced to form channel regions 114a-e therebetween that are individual to the memory cell devices 102 and the logic devices 104. In some embodiments, the source/drain regions 112 include source/drain regions shared by multiple channel regions 114. For example, the memory cell devices 102 are typically formed in pairs with source/drain regions 112 individual to the memory cell devices 102, and source/drain regions 112 shared by the memory cell devices 102 of the pairs.

Over each channel region 114 in the logic region 110, a logic device 104 includes a metal gate 116a-c electrically isolated from the channel region 114 by a high κ dielectric 118. A high κ dielectric 118 is a dielectric with a dielectric constant κ greater than the dielectric constant of silicon dioxide (i.e., 3.9). In some embodiments, a top surface of the metal gate 116 is about 350-700 Angstroms (A) from a top surface of the semiconductor substrate 106. A metal gate dielectric 120a, 120b is arranged between the semiconductor substrate 106 and the high κ dielectric 118. For high voltage applications, the metal gate dielectric 120 is typically thicker than it would otherwise be. For example, logic device 104a can be a high-voltage transistor with a thick metal gate dielectric 120a, while logic devices 104b, 104c can be low-voltage transistors with thinner metal gate dielectrics 120b. Further, an etch stop 122 is arranged between the metal gate 116 and the high κ dielectric 118. The metal gate 116 is, for example, tantalum, tantalum nitride, or niobium, the metal gate dielectric 120 is, for example, an oxide, such as silicon dioxide, the etch stop 122 is, for example, silicon nitride, and the high κ dielectric 118 is, for example, hafnium oxide ($HfO_2$), aluminum oxide ($AlO_3$), or tantalum pentoxide ($Ta_2O_5$).

Over each channel region 114 in the memory region 108, a memory cell device 102 includes a select gate 124a, 124b and a memory gate 126a, 126b spaced between the source/drain regions 112 of the channel region 114. In some embodiments, the select gate 124 is arranged proximate to a source/drain region 112 shared with another memory cell device 102, and the memory gate 126 is arranged proximate to a source/drain region 112 individual to the memory cell device 102. Whereas the metal gates 116 of the logic devices 104 are metal, the select and memory gates 124, 126 of the memory cell devices 102 are typically polysilicon. Further, a top surface of the select gate 124 is typically coplanar with top surfaces of the metal gates 116, and a top surface of the memory gate 126 is recessed about 10-1000 A below the top surfaces of the metal gates 116 and/or the select gate 124. The select gate 124 has, for example, a generally rectangular profile, and the memory gate 126 has, for example, a generally asymmetrical, stepped profile. The generally asymmetrical, stepped profile includes a memory gate ledge 128a, 128b (i.e., a lower top surface) exhibiting a reduced height relative to an upper top surface of the memory gate 126 and running along a memory gate edge facing away from the select gate 124.

A memory gate spacer 130a, 130b extends vertically up from the memory gate ledge 128, along an upper, inner sidewall of the memory gate 126. The memory gate spacer 130 extends vertically up to above (e.g., 10-1000 A above) the top surfaces of the memory gate 126 and, in some embodiments, about even with top surfaces of the select gate 124 and/or the metal gates 116. A thin memory gate sidewall structure 132a, 132b is arranged to cover a lower, outer sidewall of the memory gate 126 adjacent to the memory gate spacer 130. In some embodiments, the thin memory gate sidewall structure 132 extends vertically up from approximately even with a bottom surface of the memory gate 126, along sidewalls of the memory gate 126 and the memory gate spacer 130, to approximately coplanar with top surfaces of the memory gate spacer 130.

Arranged between the semiconductor substrate 106 and the select gate 124, a select gate dielectric 134a, 134b electrically isolates the select gate 124 from the semiconductor substrate 106. Further, arranged between the semiconductor substrate 106 and the memory gate 126, a charge trapping dielectric 136a, 136b electrically isolates the memory gate 126 from the semiconductor substrate 106. The charge trapping dielectric 136 further extends vertically up to fill the space between the memory gate 126 and the select gate 124 and to electrically isolate the memory gate 126 from the select gate 124. The charge trapping dielectric 136 extends vertically up to above (e.g., 10-1000 A above) the top surfaces of the memory gate 126 and, in some embodiments, about even with top surfaces of the select and metal gates 116, 124. The select gate dielectric 134 is, for example, an oxide, such as silicon dioxide, and the charge trapping dielectric 136 is, for example, a multilayer dielectric, such as an oxide-nitride-oxide (ONO) dielectric or an oxide-silicon dot-oxide (OSiO) dielectric.

Source/drain silicide contact pads 138a-i individual to the source/drain regions 112 are formed over the source/drain regions 112, and memory silicide contact pad 140a, 140b are formed over upper top surfaces of the memory gates 126. In some embodiments, the contact pads 138, 140 have a thickness of about 50-200 A. Conductive contacts 142a-d individual to the silicide contact pads 138, 140 and the select and metal gates 116, 124 extend vertically down to corresponding silicide contact pads 138, 140 and select and metal gates 116, 124. For readability, only some of the conductive contacts 142 are shown. The silicide contact pads 138, 140 reduce resistance between the conductive contacts 142, the source/drain regions 112 and the memory gates 126 by providing a better, lower resistance contact surface for the conductive contacts 142. The silicide contact pads 138, 140 are, for example, nickel silicide, cobalt silicide, or titanium silicide, and the conductive contacts 142 are, for example, formed of one or more of titanium, titanium nitride, and tungsten.

A main sidewall structure 144 is arranged on sidewalls of the memory cell devices 102 and the logic devices 104. The main sidewall structure 144 extends vertically up from the semiconductor substrate 106 to above (e.g., 10-1000 A above) the top surfaces of the memory gates 126 and, in some embodiments, about even with top surfaces of the select and metal gates 116, 124. For example, for a memory cell device 102, the main sidewall structure 144 extends on a first side of the memory cell device 102 from the semiconductor substrate 106, along sidewalls of the charge trapping dielectric 136 and the thin memory gate sidewall structure 132. On the opposing side of the memory cell device 102, the main sidewall structure 144 extends from the semiconductor substrate 106, along sidewalls of the select gate dielectric 134 and the select gate 124. As another example, for a logic device 104, the main sidewall structure 144 extends from the semiconductor substrate 106, along opposing sidewalls of the metal gate dielectric 120, the high κ dielectric 118, the etch stop 122, and the metal gate 116. The main sidewall structure 144 is, for example, a dielectric, such as silicon nitride.

A contact etch stop 146 is arranged over the base of the semiconductor substrate 106 above the silicide contact pads 138, 140 and along sidewalls of the main sidewall structure 144. Top surfaces of the contact etch stop 146 are above (e.g., 10-1000 A above) the top surfaces of the memory gates 126 and, in some embodiments, about even with top surfaces of the select and metal gates 116, 124.

Covering the memory cell and logic devices 102, 104, an interlayer dielectric 148 extends from the semiconductor substrate 106 over top surfaces of the memory cell and logic devices 102, 104. The interlayer dielectric 148 includes a first interlayer dielectric substructure 150 covering the memory cell and logic devices 102, 104 between the semiconductor substrate 106 and top surfaces of the memory cell and logic devices 102, 104. In some embodiments, the first interlayer dielectric substructure 150 has a top surface coplanar with the top surfaces of the memory cell and logic devices 102, 104, including the top surfaces of the select and metal gates 116, 124. The interlayer dielectric structure 148 further includes a second interlayer dielectric substructure 152 covering the top surfaces of the memory cell and logic devices 102, 104. In some embodiments, the second interlayer dielectric substructure 152 has a bottom surface coplanar with the top surfaces of the first interlayer dielectric substructure 150 and the memory cell and logic devices 102, 104, including the top surfaces of the select and metal gates 116, 124. The interlayer dielectric 148 is, for example, an oxide, such as silicon dioxide.

By way of recessing top surfaces of the memory gates 126 relative to top surfaces of the metal gates 116, the neighboring dielectrics (e.g., the charge trapping dielectric dielectrics 136), and the select gates 124, the memory silicide contact pads 140 formed over the top surfaces of the memory gates 126 are also recessed. Hence, during 28 nm manufacture, the memory silicide contact pads 140 persist after forming the logic devices 104 with HKMG technology. The planarization used to form the logic devices 104 with HKMG technology does not reach and remove the memory silicide contacts pads 140. Advantageously, the memory silicide contact pads 140 reduce resistance between the conductive contacts 142 and the memory gates 126.

In operation, each memory cell device 102 stores a variable amount of charge, such as electrons, in the charge trapping dielectric 136. The charge is advantageously stored in a non-volatile manner so that the stored charge persists in the absence of power. The amount of charge stored in the charge trapping dielectric 136 represents a value, such as binary value, and is varied through program (i.e., write), read, and erase operations. These operations are performed through selective biasing of the select gate 124 and the memory gate 126.

During a program or erase operation of a memory cell device 102, the memory gate 126 is forward or reversed biased with a high (e.g., at least an order of magnitude higher) voltage relative a voltage applied across the channel region 114 and/or relative to a voltage applied to the select gate 124. In some embodiments, forward biasing is used for a program operation, and reverse biasing is used for an erase operation. During a program operation, the high bias voltage promotes Fowler-Nordheim tunneling of carriers from the channel region 114 towards the memory gate 126. As the carriers tunnel towards the memory gate 126, the carriers become trapped in the charge trapping dielectric 136. During an erase operation, the high bias voltage promotes Fowler-Nordheim tunneling of carriers in the charge trapping dielectric 136 away from the memory gate 126. As the carriers tunnel away from the memory gate 126, the carriers become dislodged or otherwise removed from the charge trapping dielectric 136.

Charge stored in the charge trapping dielectric 136 of a memory cell device 102 screens an electric field formed between the memory gate 126 and the channel region 114 when the memory gate 126 is biased. This has an effect of increasing the threshold voltage $V_{th}$ of the memory cell device 102 by an amount $\Delta V_{th}$. During a read operation, a voltage is applied to the select gate 124 to induce part of the channel region 114 to conduct. Application of a voltage to the select gate 124 attracts carriers to part of the channel region 114 adjacent to the select gate 124. Further, a voltage greater than $V_{th}$, but less than $V_{th}+\Delta V_{th}$, is applied to the memory gate 126. If the memory cell device 102 turns on (i.e., allows charge to flow), then it stores a first data state (e.g., a logical "0"). If the memory cell device 102 does not turn on, then it stores a second data state (e.g., a logical "1").

Figure 2:
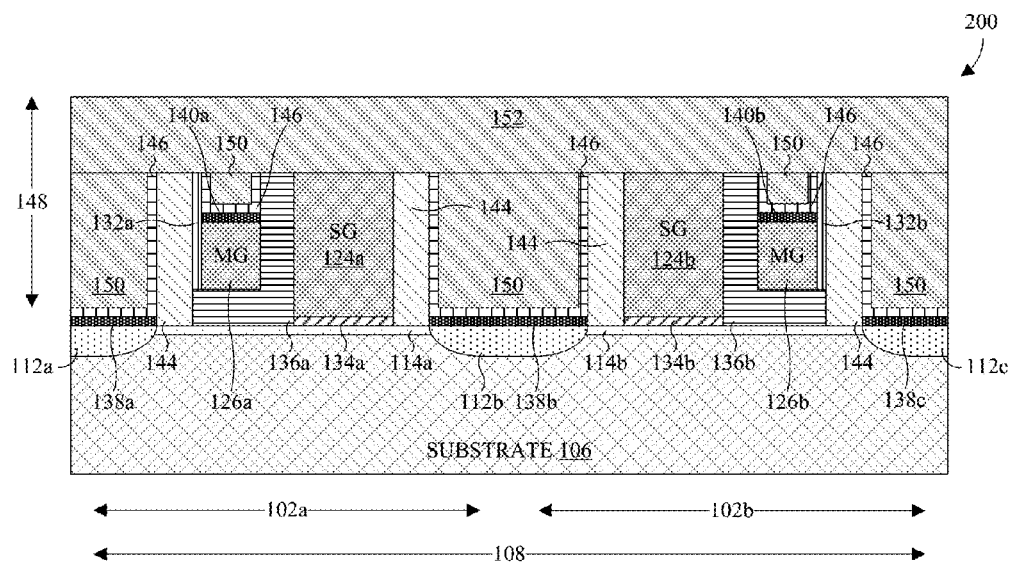
FIG. 2 illustrates a cross-sectional view of some embodiments of a semiconductor structure with memory cell devices including silicided structures suitable for integration with high κ, metal gate logic devices.

With reference to FIG. 2, a cross-sectional view 200 of alternative embodiments of the memory cell devices 102 within box I of FIG. 1A is provided. In contrast with the embodiments of FIG. 1A, the memory cell devices 102 of the present embodiments were formed without the memory gate spacers 130. As such, the memory gates 126 have a generally rectangular profile and do not have the memory gate ledges 128. In other words, the memory gates 126 each have a single top surface, as opposed to having upper and lower top surfaces. This advantageously increases the top surface area of the memory gates 126 to which the conductive contacts 142 connect.

Figure 3:
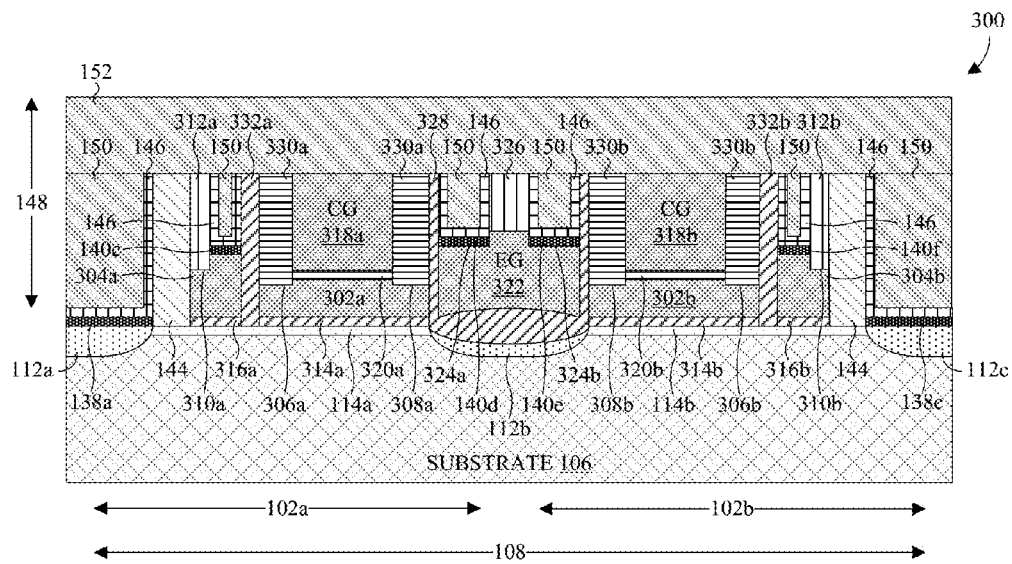
FIG. 3 illustrates a cross-sectional view of some embodiments of a semiconductor structure with memory cell devices including silicided structures suitable for integration with high κ, metal gate logic devices.

With reference to FIG. 3, a cross-sectional view 300 of other alternative embodiments of the memory cell devices 102 within box I of FIG. 1A is provided. In contrast with the embodiments of FIG. 1A, the memory cell devices 102 of the present embodiments were formed with a different structure. The memory cell devices 102 store data in a nonvolatile manner and are, for example, ESF3 split gate flash memory cell devices. The logic devices 104 coordinate to implement logic supporting operation of the memory cell devices 102 and are, for example, transistors.

Over each channel region 114 in the memory region 108, a memory cell device 102 includes a floating gate 302a, 302b and a word line 304a, 304b spaced between the source/drain regions 112 of the channel region 114. In some embodiments, the floating gate 302 is recessed on opposing sides proximate to the source/drain regions of the channel region 114 to define a pair of floating gate ledges 306a, 306b, 308a, 308b (i.e., lower top surfaces) exhibiting a reduced height relative to an upper top surface of the floating gate 302. Similarly, in some embodiments, the word line 304 is recessed on an opposite side of the word line 304 as the floating gate 302 to define a word line ledge 310a, 310b (i.e., a lower top surface) exhibiting a reduced height relative to an upper top surface of the word line 304. The lower top surface of the word line 304 is recessed relative to top surfaces of the metal gates 116 by, for example, about 10-1000 Å. A word line spacer 312a, 312b extends vertically up from the word line ledge 310, along an upper, inner sidewall of the word line 304 to above (e.g., 10-1000 Å above) the upper top surface of the word line 304 and, in some embodiments, about even with top surfaces of the metal gates 116. The floating gate 302 and the word line 304 are, for example, polysilicon, and the word line spacer 312 is, for example, silicon nitride.

Arranged between the semiconductor substrate 106 and the floating gate 302, a floating gate dielectric 314a, 314b provides electrical isolation between the semiconductor substrate 106 and the floating gate 302. Further, arranged between the word line 304 and the semiconductor substrate 106, a word line dielectric 316a, 316b provides electrical isolation between the semiconductor substrate 106 and the word line 304. The floating gate and the word line dielectrics 314, 316 are, for example, oxides, such as silicon dioxide.

A control gate 318a, 318b is arranged over the top surface of the floating gate 302 with a control gate dielectric 320a, 320b arranged between the control gate 318 and the floating gate 302. The control gate dielectric 320 electrically isolates the control gate 318 from the floating gate 302. The top surface of the control gate 318 is above (e.g., 10-1000 Å above) the top surfaces of the word line 304 and, in some embodiments, about even with top surfaces of the metal gates 116. The control gate 318 is, for example, polysilicon, and the inter-gate dielectric 320 is, for example, an ONO dielectric.

Each memory cell device 102 further includes an erase gate 322. The erase gate 322 is arranged over a source/drain region 112 of the channel region 114 that is shared with a neighboring memory cell device 102 and on an opposite side of the floating gate 302 as the word line 304. In some embodiments, the erase gate 322 is recessed on opposing sides proximate to the neighboring memory cell devices 102 to define a pair of erase gate ledges 324a, 324b (i.e., lower top surfaces) exhibiting a reduced height relative to an upper top surface of the erase gate 322. The lower top surfaces of the erase gate 322 are recessed relative to top surfaces of the metal gates 116 and/or the control gate 318 by about 10-1000 Å. An erase gate spacer 326 extends vertically up from the upper top surface of the erase gate 322 (between the erase gate ledges 324) to above (e.g., 10-1000 Å above) the top surfaces of the word line 304 and the erase gate 322 and, in some embodiments, about even with top surfaces of the metal gates 116 and/or the control gate 318. The erase gate 322 is, for example, polysilicon, and the erase gate spacer 326 is, for example, silicon nitride.

Lining a central region between neighboring memory cell devices 102, a dielectric liner 328 insulates the erase gate 322 from the semiconductor substrate 106, the floating gate 302, and the control gate 318. Arranged between the control gate 318 and both the erase gate 322 and the word line 304, a floating gate spacer 330a, 330b provides electrical isolation. Arranged between the word line 304 and the floating gate 302, a thin floating gate sidewall structure 332a, 332b electrically isolates the floating gate 302 from the word line 304. Each of the dielectric liner 328, the floating gate spacer 330, and the thin floating gate sidewall structure 332 extends vertically up to above (e.g., 10-1000 Å above) the top surfaces of the word line 304 and the erase gate 322 and, in some embodiments, about even with top surfaces of the metal gates 116 and/or the control gate 318. The dielectric liner 328 and the thin floating gate sidewall structure 332 are, for example, oxides, such as silicon dioxide, and the floating gate spacer 330 is, for example, an ONO dielectric.

Source/drain silicide contact pads 138a, 138c individual to the source/drain regions 112 are formed over all the source/drain regions 112, except those over which the erase gate 318 is formed. Further, memory silicide contact pad 140c-f are formed over the upper top surfaces of the word lines 304 and the lower top surfaces of the erase gate 322.

Conductive contacts individual to the silicide contact pads 138, 140 extend vertically down to corresponding silicide contact pads 138, 140. For readability, the conductive contacts are not shown. A main sidewall structure 144 is arranged on sidewalls of the memory cell devices 102. The main sidewall structure 144 extends vertically up from the semiconductor substrate 106 to above (e.g., 10-1000 A above) the top surfaces of the word lines 304 and the erase gate 322 and, in some embodiments, about even with top surfaces of the metal gates 116 and/or the control gate 318. For example, for a memory cell device 102, the main sidewall structure 144 extends from the semiconductor substrate 106, along sidewalls of the word line dielectric 316, the word line 304, and the word line spacer 312.

By way of recessing top surface of the word lines 304 and the erase gate 322 relative to top surfaces of the metal gates 116, the neighboring dielectrics (e.g., the word line spacer 312), and the control gates 318, the memory silicide contact pads 140 are also recessed. Hence, during 28 nm manufacture, the memory silicide contact pads 140 persist after forming the logic devices 104 with HKMG technology. The planarization used to form the logic devices 104 with HKMG technology does not reach and remove the memory silicide contacts pads 140. Advantageously, the memory silicide contact pads 140 reduce resistance between the conductive contacts 142, the erase gate 322 and the word lines 304.

In operation, each memory cell device 102 stores a variable amount of charge, such as electrons, in the floating gate 302. The charge is advantageously stored in a non-volatile manner so that the stored charge persists in the absence of power. The amount of charge stored in the floating gate 302 represents a value, such as binary value, and is varied through program (i.e., write), read, and erase operations. These operations are performed through selective biasing of the control gate 318, the word line 304, and the erase gate 322.

During a program operation of a memory cell device 102, the control gate 318 is biased with a high (e.g., at least an order of magnitude higher) voltage relative a voltage applied across the channel region 114 and/or relative to a voltage applied to the word line 304. The high bias voltage promotes Fowler-Nordheim tunneling of carriers from the channel region 114 towards the control gate 318. As the carriers tunnel towards the control gate 318, the carriers become trapped in the floating gate 302.

During an erase operation of a memory cell device 102, the erase gate 322 is biased with a high (e.g., at least an order of magnitude higher) voltage relative a voltage applied across the channel region 114 and/or relative to a voltage applied to the control gate 318. The high bias voltage promotes Fowler-Nordheim tunneling of carriers from the floating gate 302 towards the erase gate 322. As the carriers tunnel towards the erase gate 322, the carriers become dislodged or otherwise removed from the floating gate 302.

Charge stored in the floating gate 302 of a memory cell device 102 screens an electric field formed between the control gate 318 and the channel region 114 when the control gate 318 is biased. This has an effect of increasing the threshold voltage $V_{th}$ of the memory cell device 102 by an amount $\Delta V_{th}$. During a read operation, a voltage is applied to the word line 304 to induce part of the channel region 114 to conduct. Application of a voltage to the word line 304 attracts carriers to part of the channel region 114 adjacent to the word line 304. Further, a voltage greater than $V_{th}$, but less than $V_{th}+\Delta V_{th}$, is applied to the control gate 318 If the memory cell device 102 turns on (i.e., allows charge to flow), then it stores a first data state (e.g., a logical "0"). If the memory cell device 102 does not turn on, then it stores a second data state (e.g., a logical "1").

Figure 4:
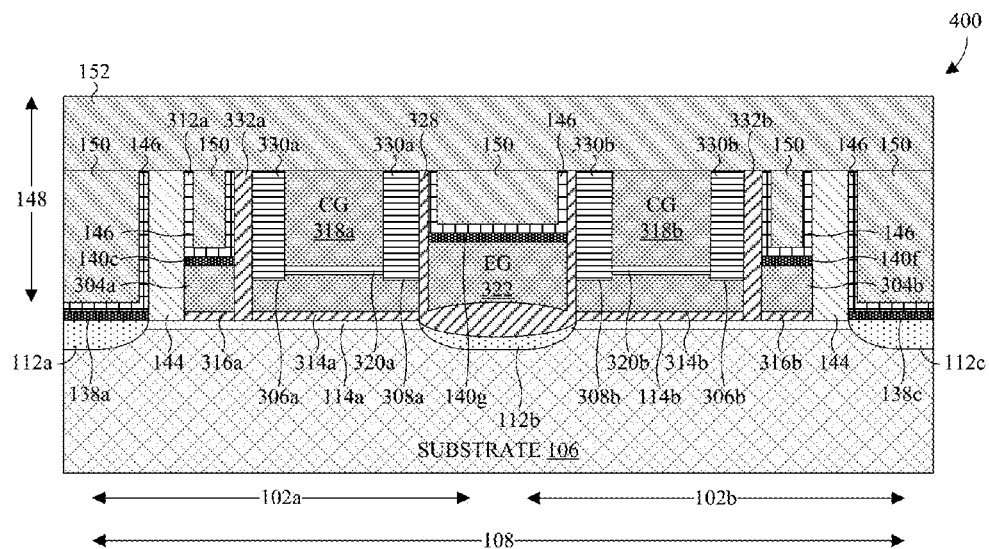
FIG. 4 illustrates a cross-sectional view of some embodiments of a semiconductor structure with memory cell devices including silicided structures suitable for integration with high κ, metal gate logic devices.

With reference to FIG. 4, a cross-sectional view 400 of yet other alternative embodiments of the memory cell devices 102 within box I of FIG. 1A is provided. In contrast with the embodiments of FIG. 3, the memory cell devices 102 of the present embodiments were formed without the word line spacers 312 and the erase gate spacer 326. As such, the word lines 304 and the erase gate 322 have a generally rectangular profile and do not have the word line and erase gate ledges 310, 324. In other words, the word lines 304 and the erase gate 322 each have a single top surface, as opposed to having upper and lower top surfaces. Further, instead of having two memory silicide contact pads 140d, 140e formed over the erase gate 322, the erase gate 322 only includes a single silicide contact pad 140g formed thereover. Removing the word line and erase gate spacers 312, 326 increases the top surface area of the word lines 304 and the erase gates 322 to which the conductive contacts 142 interface. This advantageously increases the ease with which conductive contacts 142 are formed.

While the foregoing discussion focused on MONOS, SONOS, and ESF3 split gate flash memory cells, it should be appreciated that other types of memory cell devices can employ the silicided structure described above. That is to say, other types of memory cell devices with two neighboring gates can include a memory silicide contact pad arranged over a recessed one of the neighboring gates, and a contact etch stop and a first interlayer dielectric substructure arranged over the memory silicide contact pad.

Figure 5:
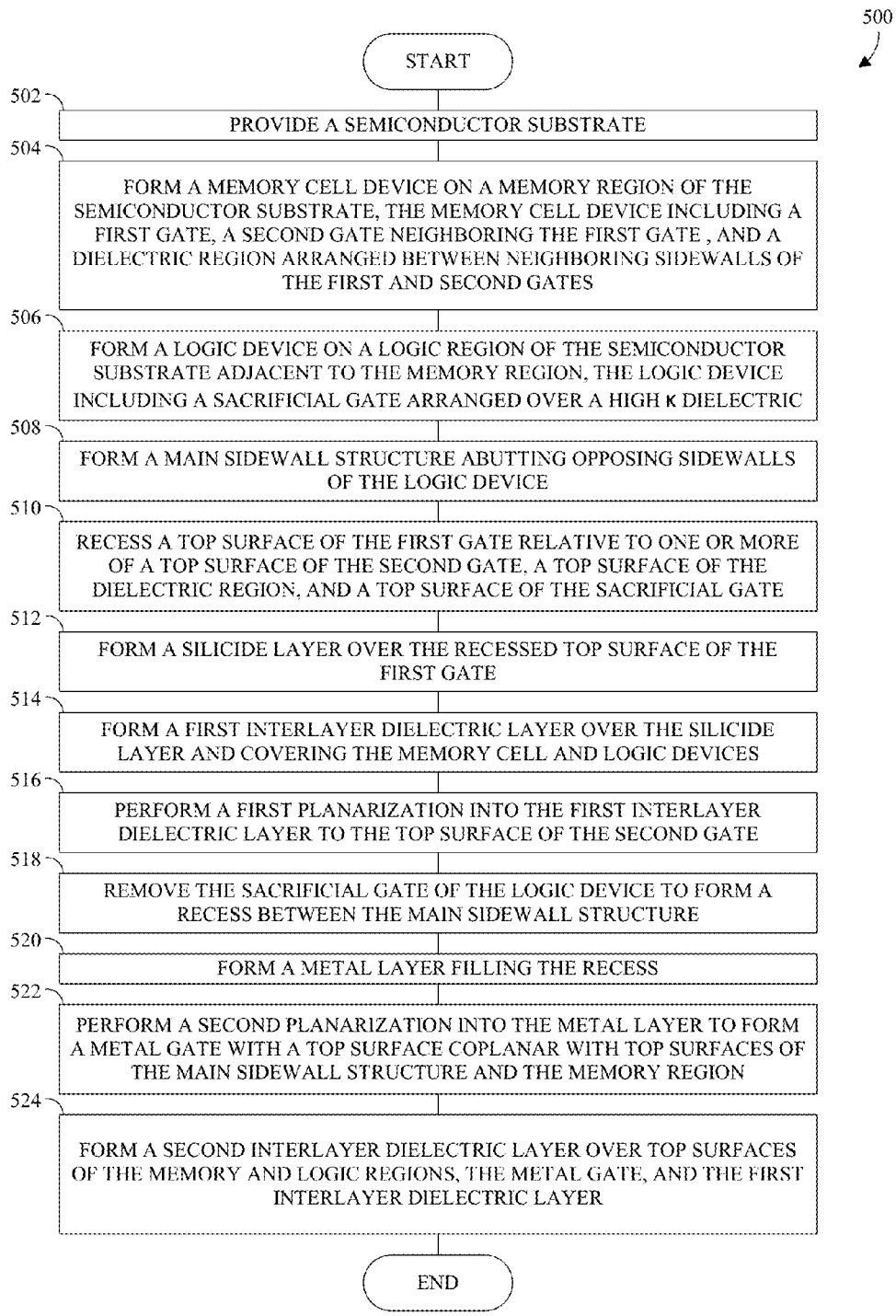
FIG. 5 illustrates a flow chart of some embodiments of a method of manufacturing a semiconductor structure with memory cell devices and high κ, metal gate logic devices, the memory cell devices including silicided structures.

With reference to FIG. 5, a flow chart 500 of some embodiments of a method for manufacturing the semiconductor structure is provided. According to the method, a semiconductor substrate is provided (Action 502). A memory cell device is formed (Action 504) over a memory region of the semiconductor substrate. The memory cell device includes a first gate, a second gate neighboring the first gate, and a dielectric region arranged between neighboring sidewalls of the first and second gates. A logic device is formed (Action 506) on a logic region of the semiconductor substrate adjacent to the memory region. The logic device includes a sacrificial gate arranged over a high κ dielectric. A main sidewall structure abutting opposing sidewalls of the logic device is formed (Action 508). A top surface of the first gate is recessed (Action 510) relative to one or more of a top surface of the second gate, a top surface of the dielectric region, and a top surface of the sacrificial gate. The extent of the recess is, for example, about 10-1000 A. A silicide layer is formed (Action 512) over the recessed top surface of the first gate. A first interlayer dielectric layer is formed (Action 514) over the silicide layer and covering the memory cell and logic devices. A first planarization into the first interlayer dielectric layer is performed (Action 516) to the top surface of the second gate. The sacrificial gate of the logic device is removed (Action 518) to form a recess between the main sidewall structure. A metal layer filling the recess is formed (Action 520). A second planarization is performed (Action 522) into the metal layer to form a metal gate with a top surface coplanar with top surfaces of the main sidewall structure and the memory region. A second interlayer dielectric layer is formed (Action 524) over top surfaces of the memory and logic regions, the metal gate, and the first interlayer dielectric layer.

The first and second planarizations are performed to a level above the recessed top surface of the first gate and to a level above the top surface of the silicide layer. As such, the silicide layer persists during the formation of the metal gate and is formed in a manner compatible with HKMG technology. Advantageously, the silicide layer allows a lower resistivity connection between subsequently formed contacts and the first gate over which the silicide layer is formed. Further, by performing the first and second planarizations to a level above the recessed top surface of the first gate and the top surface of the silicide layer, the risk of metal contamination is advantageously reduced.

Figure 6A:
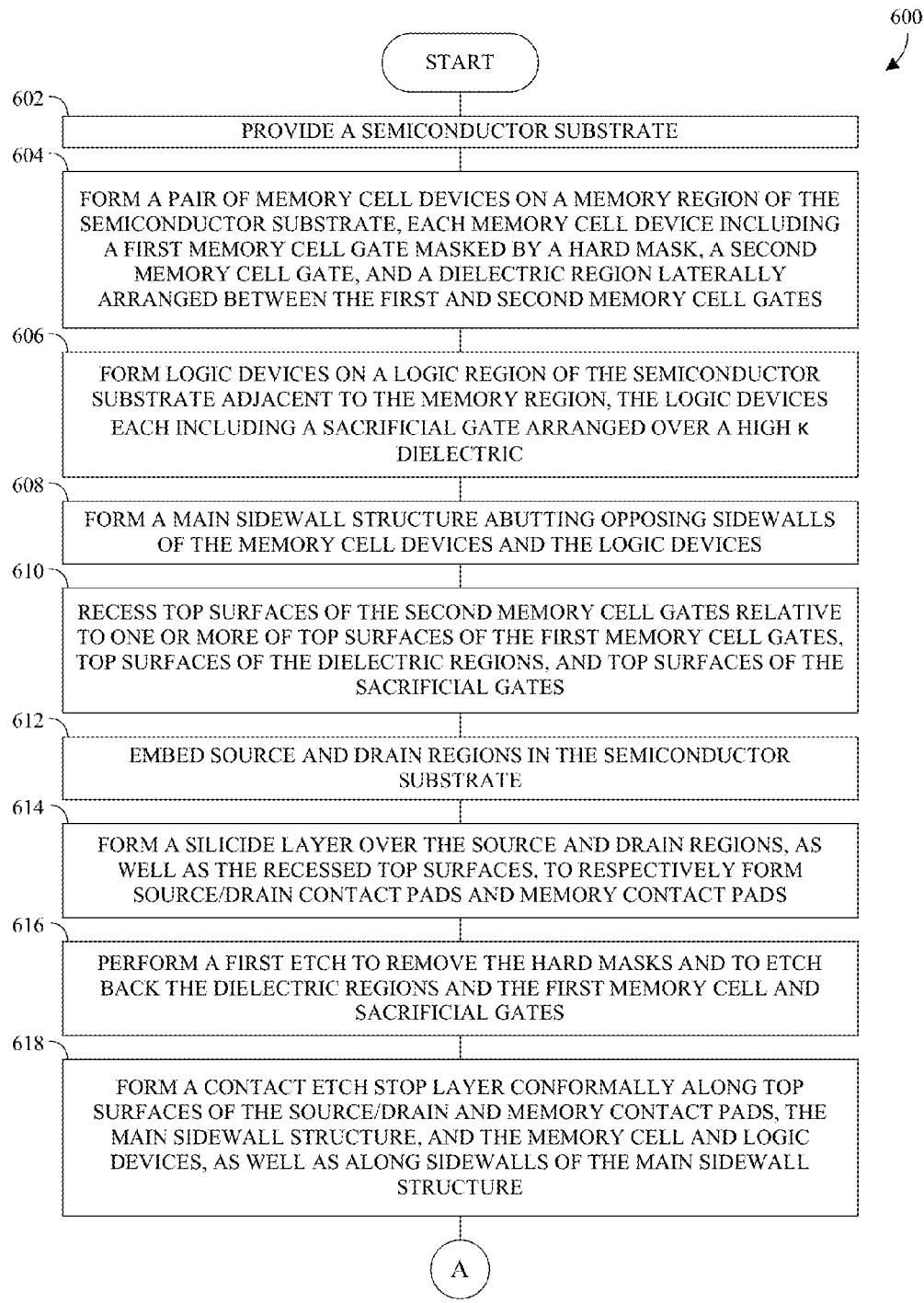
FIGS. 6A & B illustrate a flow chart of some embodiments of a method of manufacturing a semiconductor structure with memory cell devices and high κ, metal gate logic devices, the memory cell devices including silicided structures.
Figure 6B:
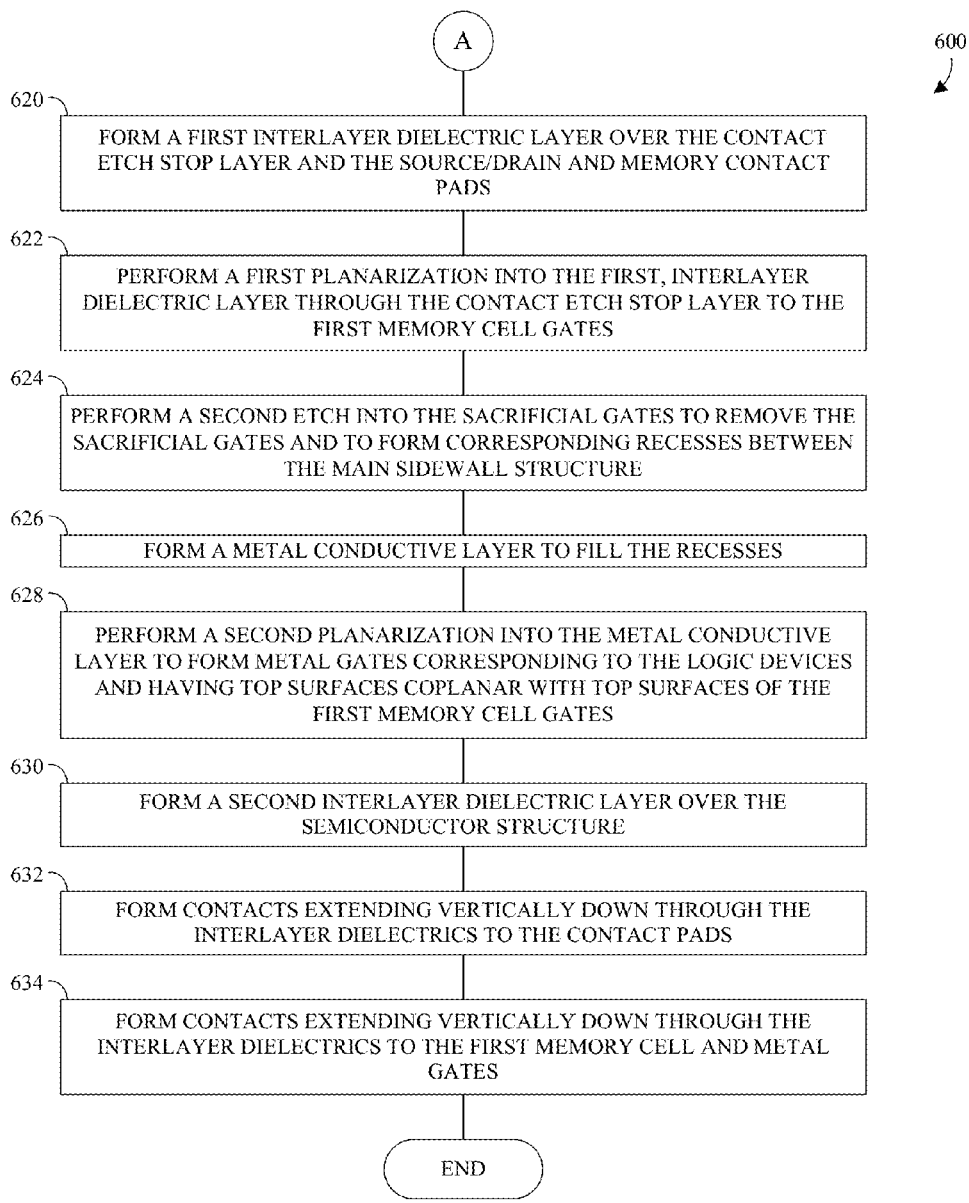

With reference to FIGS. 6A & B, a flow chart 600 of some embodiments of an expanded method for manufacturing the semiconductor structure is provided. The expanded method is typically employed in connection with SONOS, MONOS, or ESF3 split gate flash memory cell devices, but it is to be understood that it is equally applicable to other types of memory cell devices.

According to the expanded method, a semiconductor substrate is provided (Action 602). A pair of memory cell devices is formed (Action 604) on a memory region of the semiconductor substrate. Each memory cell device includes a first memory cell gate masked by a hard mask, a second memory cell gate, and a dielectric region laterally arranged between the first and second memory cell gates. Logic devices are formed (Action 606) on a logic region of the semiconductor substrate adjacent to the memory region. The logic devices each include a sacrificial gate arranged over a high κ dielectric. A main sidewall structure abutting opposing sidewalls of the memory cell devices and the logic devices is formed (Action 608). Top surfaces of the second memory cell gates are recessed (Action 610) relative to one or more of top surfaces of the first memory cell gates, top surfaces of the dielectric regions, and top surfaces of the sacrificial gates. Source and drain regions are embedded (Action 612) in the semiconductor substrate. A silicide layer is formed (Action 614) over the source and drain regions, as well as the recessed top surfaces, to respectively form source/drain contact pads and memory contact pads. A first etch is performed (Action 616) to remove the hard masks and to etch back top portions of the dielectric regions and stop on the first memory cell and sacrificial gates. A contact etch stop layer is formed (Action 618) conformally along top surfaces of the source/drain and memory contact pads, the main sidewall structure, and the memory cell and logic devices, as well as along sidewalls of the main sidewall structure. A first interlayer dielectric layer is formed (Action 620) over the contact etch stop layer and the source/drain and memory contact pads. A first planarization is performed (Action 622) into the first, interlayer dielectric layer through the contact etch stop layer to the first memory cell gates. A second etch is performed (Action 624) into the sacrificial gates to remove the sacrificial gates and to form corresponding recesses between the main sidewall structure. A metal conductive layer is formed (Action 626) to fill the recesses. A second planarization is performed (Action 628) into the metal conductive layer to form metal gates corresponding to the logic devices and having top surfaces coplanar with top surfaces of the first memory cell gates. A second interlayer dielectric layer is formed (Action 630) over the semiconductor structure. Contacts extending vertically down through the interlayer dielectrics to the contact pads are formed (Action 632). Contacts extending vertically down through the interlayer dielectrics to the first memory cell and metal gates are formed (Action 634).

While the disclosed methods (e.g., the methods described by the flowcharts 500, 600) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 7-27, cross-sectional views of some embodiments of the semiconductor structure at various stages of manufacture are provided to illustrate the expanded method. Although FIGS. 7-27 are described in relation to the expanded method, it will be appreciated that the structures disclosed in FIGS. 7-27 are not limited to the expanded method, but instead may stand alone as structures independent of the expanded method. Similarly, although the expanded method is described in relation to FIGS. 7-27, it will be appreciated that the expanded method is not limited to the structures disclosed in FIGS. 7-27, but instead may stand alone independent of the structures disclosed in FIGS. 7-27.

Figure 7:
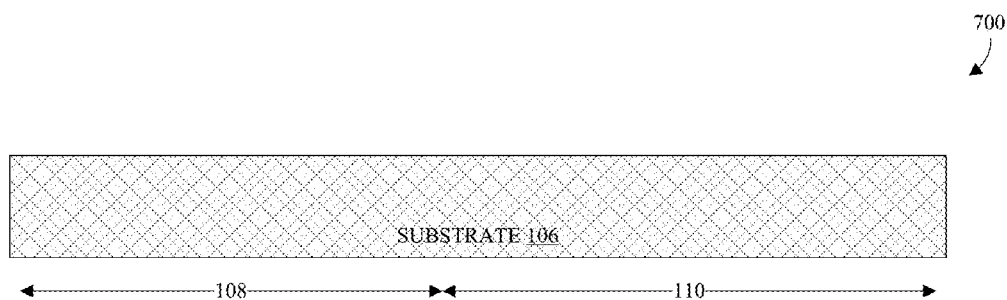
FIGS. 7-27 illustrate a series of cross-sectional views of some embodiments of a semiconductor structure with memory cell devices and high κ, metal gate logic devices, the memory cell devices including silicided structures.

FIG. 7 illustrates a cross-sectional view 700 of some embodiments corresponding to Action 602. As shown by FIG. 7, a semiconductor substrate 106 is provided. The semiconductor structure includes a memory region 108 and a logic region 110 typically arranged around the memory region 108. The semiconductor substrate 106 is typically planar with a uniform thickness. Further, the semiconductor substrate 106 is, for example, a bulk substrate of silicon, germanium, or group III and group V elements. Alternatively, the semiconductor substrate 106 is, for example, a SOI substrate.

FIGS. 8-14 illustrate cross-sectional views 800-1400 of some embodiments corresponding to Action 604.

Figure 8:
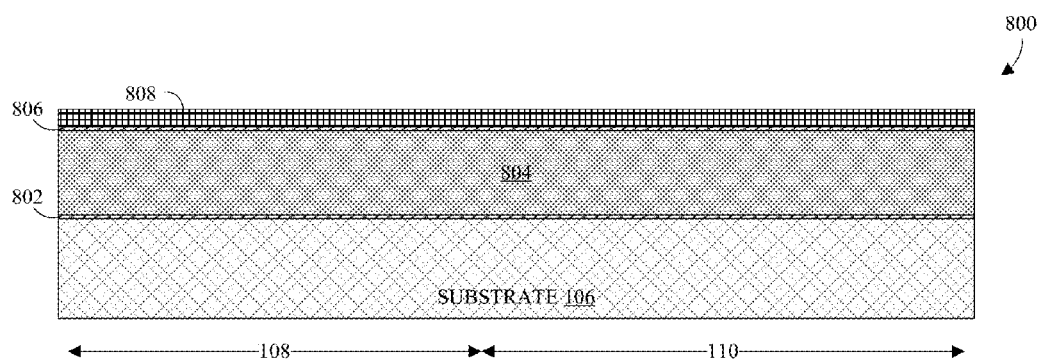

As shown by FIG. 8, a first dielectric layer 802, a first conductive layer 804, a second dielectric layer 806, and a hard mask layer 808 are stacked or formed in that order over a top surface of the semiconductor substrate 106. Each of the layers 802-808 typically has a uniform thickness. The first and second dielectric layers 802, 806 are, for example, an oxide, such as silicon dioxide. The first conductive layer 804 is formed from a silicon based material, such as polysilicon, for a SONOS split gate flash memory cell, and the first conductive layer 804 is formed from a metal or metal alloy for a MONOS split gate flash memory cell. The hard mask layer 808 is, for example, a nitride or a multilayer nitride-oxide-nitride (NON) film.

Figure 9:
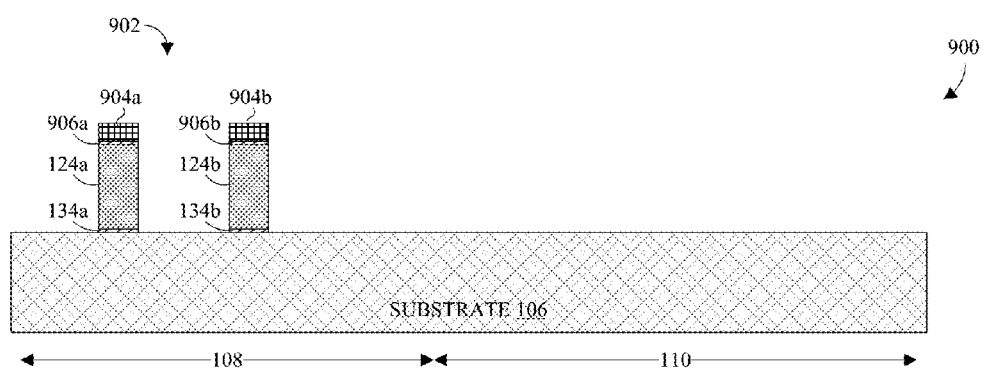

As shown by FIG. 9, a first etch is performed through the hard mask, second dielectric, first conductive, and first dielectric layers 802-808 to form a pair of spaced select gates 124a, 124b in the memory region 108 of the semiconductor substrate 106. The select gates 124 form a central region 902 between the select gates 124 and rest upon select gate dielectrics 134a, 134b electrically isolating the select gates 124 from the semiconductor substrate 106. Further, the select gates 124 are masked by memory hard masks 904a, 904b electrically isolated from the select gate 124 by memory hard mask dielectrics 906a, 906b.

Figure 10:
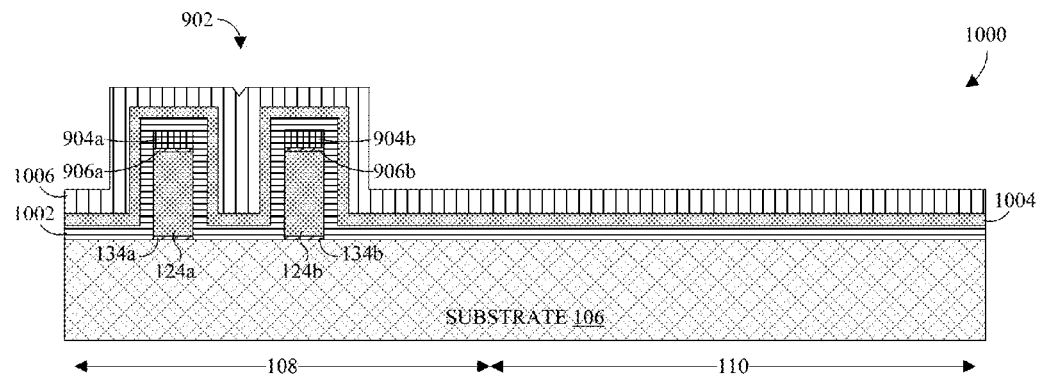

As shown by FIG. 10, a charge trapping dielectric layer 1002, a second conductive layer 1004, and a third dielectric layer 1006 are conformally formed, in that order, over the semiconductor structure. In alternative embodiments, the third dielectric layer 1006 is omitted. The charge trapping dielectric layer 1002 is conformally formed over top surfaces of the semiconductor substrate 106 and the memory hard masks 904, and along sidewalls of the select gate dielectrics 134, the select gates 124, the memory hard mask dielectrics 906, and the memory hard masks 904. The second conductive layer 1004 is conformally formed over the charge trapping dielectric layer 1002, and the third dielectric layer 1006 is conformally formed over the second conductive layer 1004. In some embodiments, the second conductive layer 1004 has a thickness of about 100 A and the charge trapping dielectric has a thickness of about 100-200 A. The charge trapping dielectric layer 1002 is, for example, a multilayer charge trapping dielectric, such as an ONO dielectric or an OSiO dielectric, the second conductive layer 1004 is, for example, polysilicon, and the third dielectric layer 1006 is, for example, silicon nitride.

Figure 11:
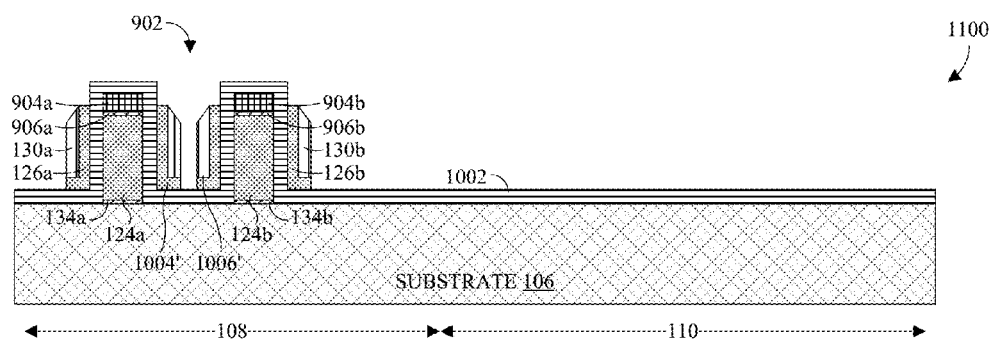

As shown by FIG. 11, a second etch is performed through the second conductive layer 1004 and the third dielectric layer 1006 to form a pair of memory gates 126a, 126b over and laterally abutting the charge trapping dielectric 1002, as well as a pair of memory gate spacers 130a, 130b over and laterally abutting corresponding memory gates 126.

Figure 12:
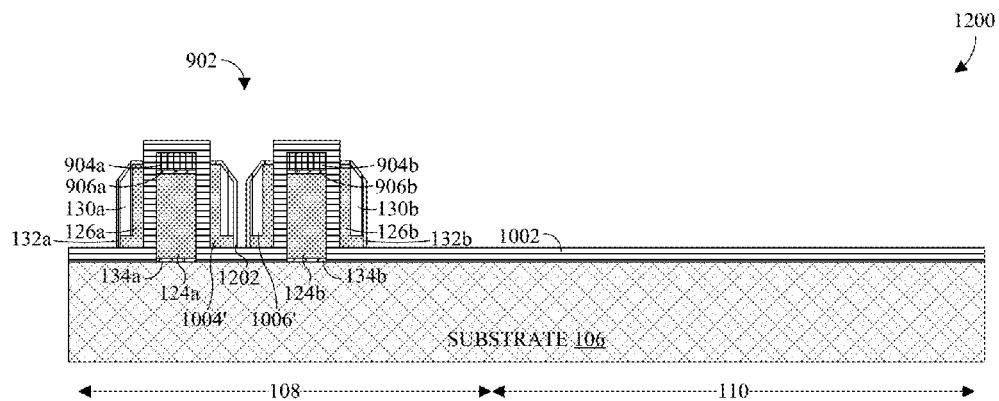

As shown by FIG. 12, a pair of thin memory gate sidewall structure 132a, 132b corresponding to the memory gates 126 are formed as part of a fourth, conformal dielectric layer 1202 to cover exposed sidewalls of the memory gates 126. For example, an intermediate dielectric layer can be conformally deposited and selectively etched to form the fourth dielectric layer 1202 with the thin memory gate sidewall structures 132. Also, of note, portions of the fourth dielectric layer 1202 mask the top surfaces of the memory gates 126. The fourth dielectric layer 1202 is, for example, silicon nitride.

Figure 13:
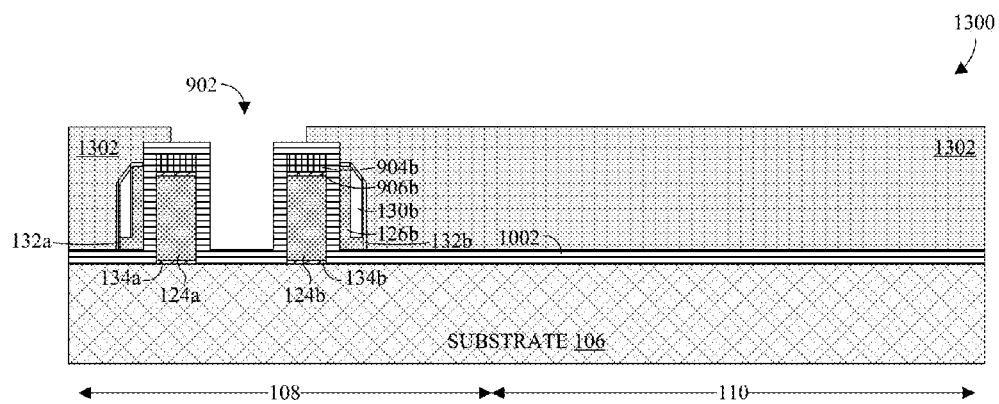

As shown by FIG. 13, a mask 1302 is formed and a third etch is performed through portions of the remaining second conductive layer 1004', the remaining third dielectric layer 1006', and the fourth dielectric layer 1202 in the central region 902 to remove these portions from the central region 902. Typically, the fourth etch is an isotropic dry etch.

Figure 14:
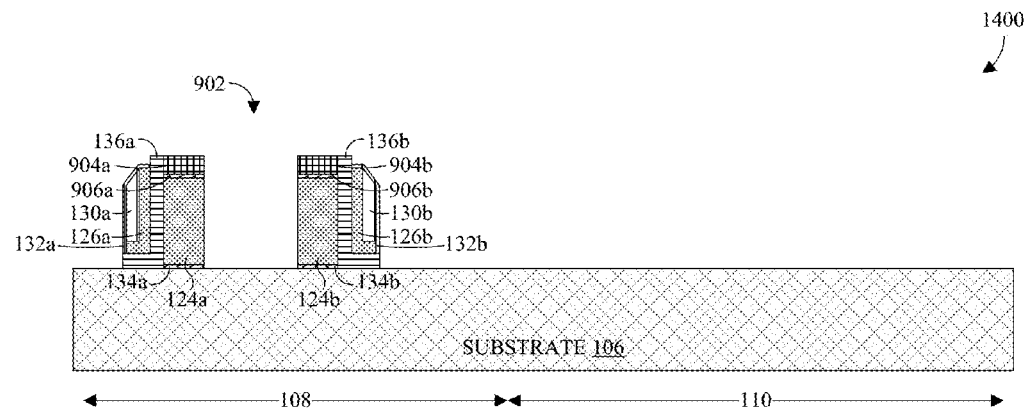

As shown by FIG. 14, a fourth etch is performed through the charge trapping dielectric layer 1002 to remove uncovered, horizontal portions of the charge trapping dielectric layer 1002. This results in charge trapping dielectrics 136a, 136b individual to the memory gates 126. In some embodiments, the uncovered portions of the charge trapping dielectric layer 1002 include portions covering the memory hard masks 904. Further, in some embodiments, the memory hard masks 904, the thin memory gate sidewall structures 132, and the memory gate spacers 130 act as a mask during the fourth etch. The fourth etch can, for example, be a fully dry etch, a fully wet etch, or a combination wet and dry etch.

Figure 15:
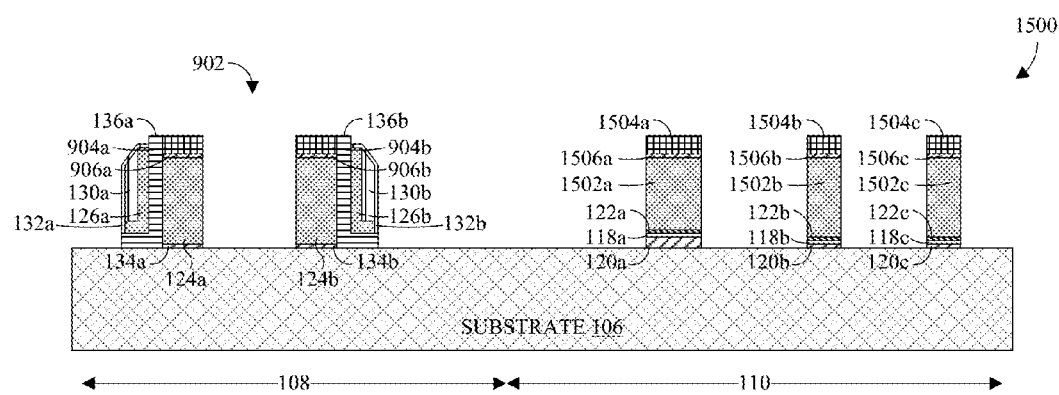

FIG. 15 illustrates a cross-sectional view 1500 of some embodiments corresponding to Action 606. As shown by FIG. 15, a trio of sacrificial gates 1502a-c is formed over corresponding high κ dielectrics 118a-c in the logic region 110 of the semiconductor substrate 106. The sacrificial gates 1502 are masked by logic hard masks 1504a-c electrically isolated from the sacrificial gates 1502 by logic hard mask dielectrics 1506a-c. Further, metal gate dielectrics 120a-c corresponding to the sacrificial gates 1502 are formed between the semiconductor substrate 106 and the high κ dielectrics 118, and etch stops 122a-c corresponding to the sacrificial gates 1502 are formed between the sacrificial gate 1502 and the high κ dielectrics 118. For high voltage applications, the metal gate dielectric 120 is typically thicker than it would otherwise be. The sacrificial gates 1502 are, for example, polysilicon, the metal gate and logic hard mask dielectrics 120, 1506 are, for example, an oxide, such as silicon dioxide, the etch stops 122 are, for example, silicon nitride, the high κ dielectric 118 is, for example, HfO$_2$, AlO$_3$, or Ta$_2$O$_5$, and the logic hard masks 1504 are, for example, an oxide, a silicon nitride or a multilayer nitride-oxide-nitride (NON) film. In some embodiments, the logic hard masks 1504 have a thickness of 50-1100 A.

Figure 16:
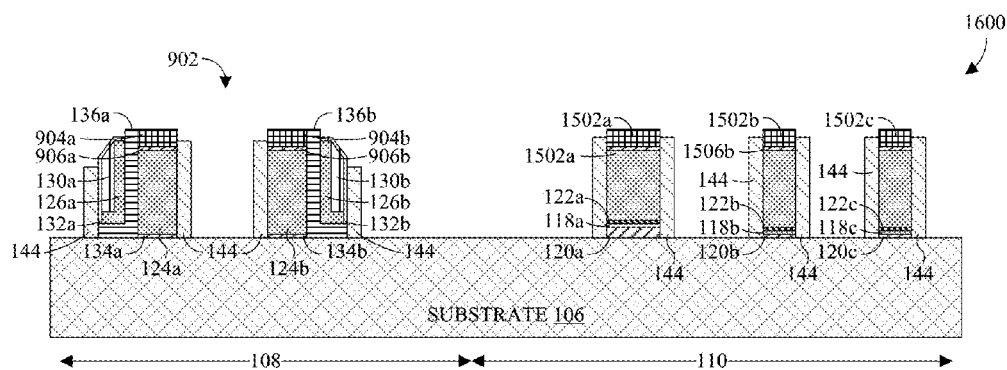

FIG. 16 illustrates a cross-sectional view 1600 of some embodiments corresponding to Action 608. As shown by FIG. 16, a main sidewall structure 144 is formed along sidewalls of the select gates 124 in the central region 902, and along sidewalls of the charge trapping dielectrics 136 and the thin memory gate sidewall structures 132 outside the central region 902. Further, the main sidewall structure 144 is formed along opposing sidewalls of the sacrificial gates 1502, logic hard mask dielectrics 1506, and the logic hard masks 1504. In some embodiments, a resist protect oxide (RPO) layer is also formed over the main sidewall structure 144. The main sidewall structure 144 can be formed by, for example, conformally forming an intermediate dielectric layer and selectively etching the intermediate dielectric layer to form the main sidewall structure 144. The main sidewall structure 144 is, for example, a dielectric, such as silicon nitride.

Figure 17:
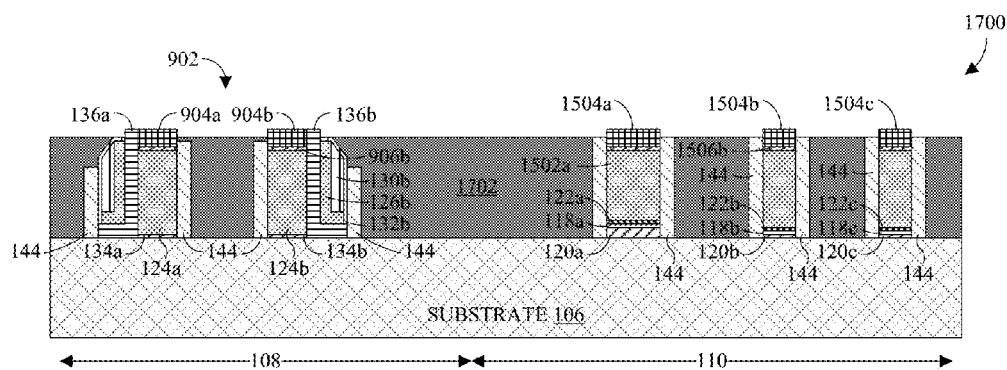
Figure 18:
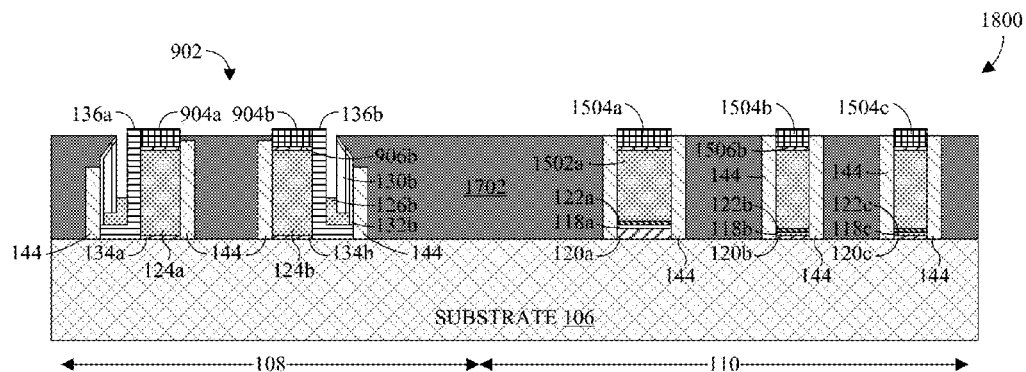
Figure 19:
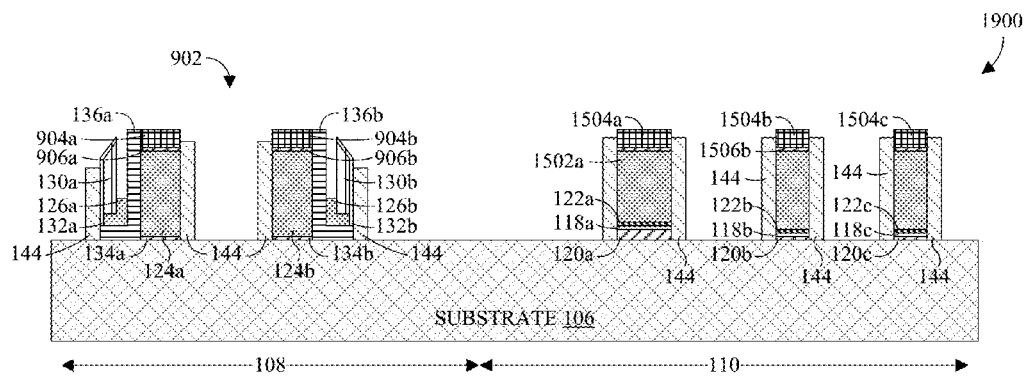

FIGS. 17-19 illustrate cross-sectional views 1700-1900 of some embodiments corresponding to Action 610. As shown by FIG. 17, a bottom anti-reflective coating (BARC) coating 1702 is formed over the logic region 110 and around the memory region 108 (e.g., around the main sidewall structure 144 in the memory region 108). As shown by FIG. 18, a fifth etch is performed through portions of the thin memory gate sidewall structures 132 and partially into the memory gates 126 to recess top surfaces of the memory gates 126 relative to top surfaces of neighboring dielectric regions (e.g., the charge trapping dielectrics 136 or the memory gate spacers 130) and/or relative to top surfaces of the sacrificial and/or select gates 124, 1502. In some embodiments, the fifth etch recesses the top surfaces of the memory gates 126 about 10-1000 A below top surfaces of neighboring dielectric regions and/or top surfaces of the sacrificial and/or select gates 124, 1502. The fifth etch includes a BARC etch back followed by a highly selective etch of the memory gates 126, typically formed of polysilicon. The BARC etch back etches back exposed portions of the memory region 108 using, for example, a chemistry comprised of one or more of diatomic oxygen (O$_2$), diatomic chlorine (Cl$_2$), or Tetrafluoromethane (CF$_4$). The highly selective etch preferentially etches the memory gates 126 using, for example, a dry etch chemistry comprised of Cl$_2$, boron trichloride (BCl$_3$), argon (Ar), or a fluorine gas. Alternatively, the highly selective etch preferentially etches the memory gates 126 using, for example, a wet etch chemistry comprised of an alkali solution. As shown by FIG. 19, the BARC coating 1702 is removed.

Figure 20:
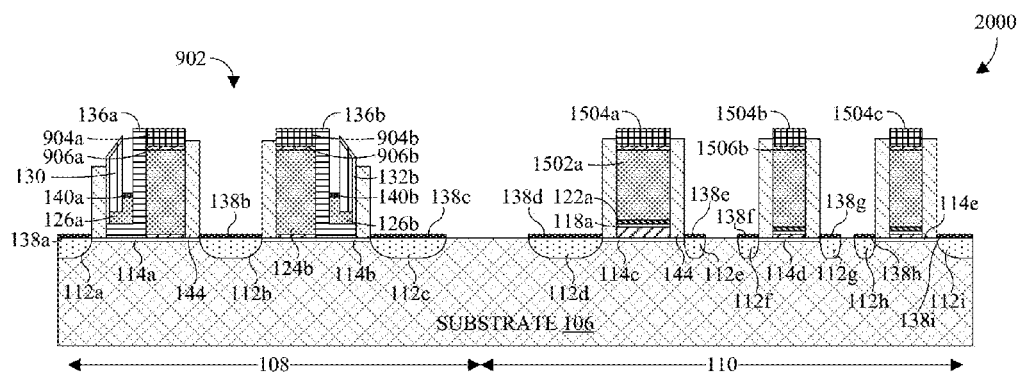

FIG. 20 illustrates a cross-sectional view 2000 of some embodiments corresponding to Actions 612 and 614. As shown by FIG. 20, source and drain regions 112a-i are embedded within the semiconductor substrate 106 to form channel regions 114a-e, and a silicide layer is formed over the source and drain regions 112 to form source/drain silicide contact pads 138a-i and memory contact pads 140a, 140b. In some embodiments, the silicide layer has a thickness of about 50-200 A. The silicide layer is, for example, nickel silicide, cobalt silicide, or titanium silicide.

Figure 21:
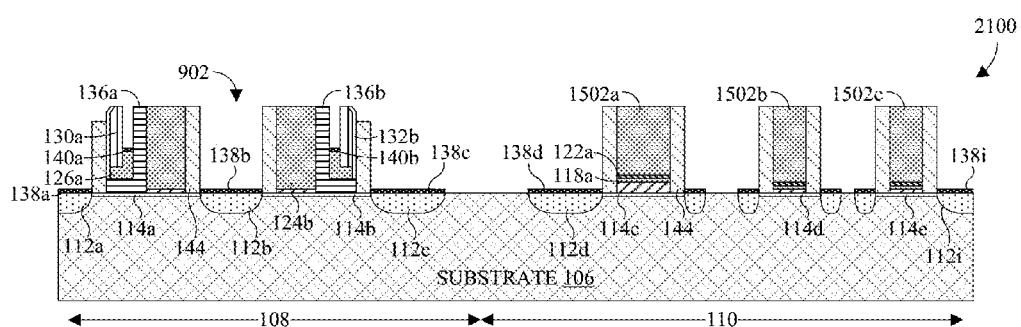

FIG. 21 illustrates a cross-sectional view 2100 of some embodiments corresponding to Action 616. As shown by FIG. 21, a sixth etch is performed to remove the memory and logic hard masks 904, 1504 and the memory and logic hard mask dielectrics 906, 1506. The sixth etch further stops on the sacrificial gates 1502 and the select gates 124, while minimally etching back the main sidewall structure 144, the memory gate spacers 130, the charge trapping dielectrics 136, and the thin memory gate sidewall structures 132. The etch back is, for example, a BARC etch back.

Figure 22:
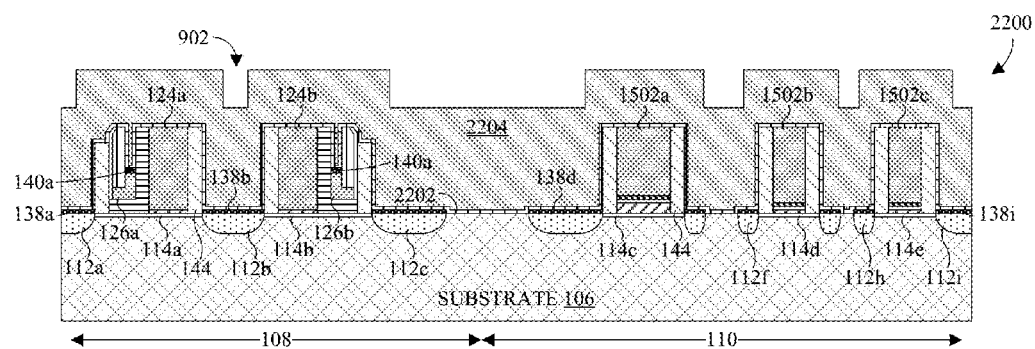

FIG. 22 illustrates a cross-sectional view 2200 of some embodiments corresponding to Action 618 and 620. As shown by FIG. 22, a contact etch stop layer 2202 is conformably formed over the semiconductor structure. The contact etch stop layer 2202 runs along top surfaces of the contact pads 138, 140 and the memory, select, and sacrificial gates 124, 126, 1502, as well as along sidewalls of the main sidewall structures 144. Also shown, a fifth, interlayer dielectric layer 2204 is formed over the contact etch stop layer 2202. The contact etch stop layer 2202 is, for example, silicon nitride, and the interlayer dielectric layer 2204 is, for example, an oxide, such as silicon dioxide.

Figure 23:
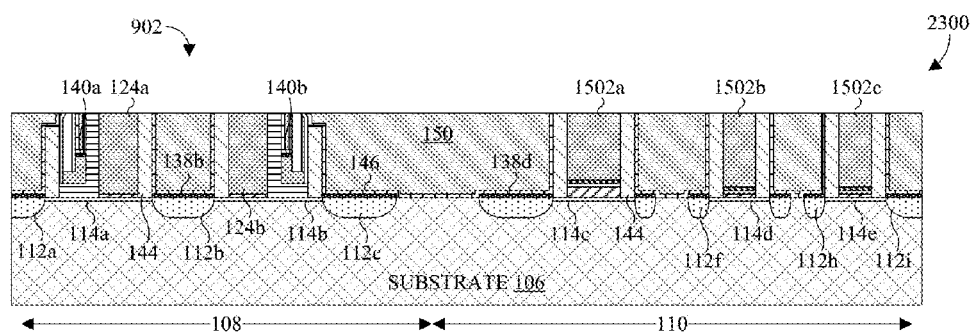

FIG. 23 illustrates a cross-sectional view 2300 of some embodiments corresponding to Action 622. As shown by FIG. 23, a first planarization is performed into the fifth, interlayer dielectric layer 2204, through the contact etch stop layer 2202, and stops on the select gates 124. This forms a contact etch stop 146 and a first interlayer dielectric substructure 150. In some embodiments, the first planarization is also into the select gates 124 and the sacrificial gates 1502 to co-planarize top surfaces of these gates 124, 1502 and/or otherwise reduce the height of these gates 124, 1502. The first planarization can, for example, be performed using a chemical machine polish (CMP).

Figure 24:
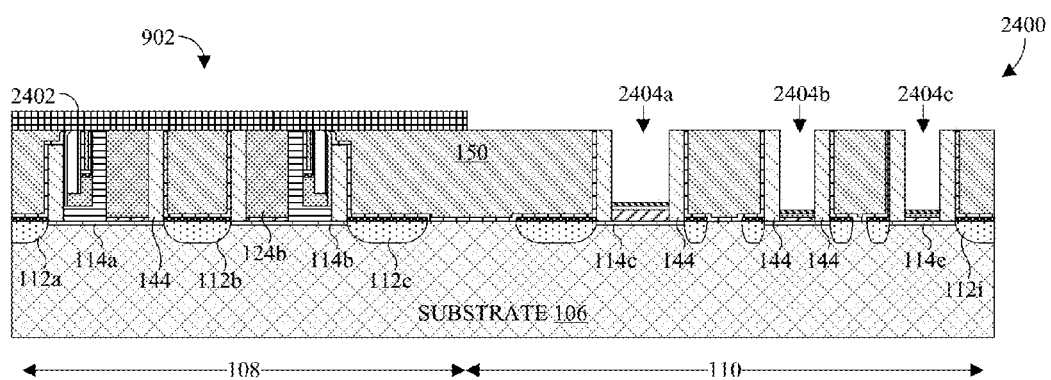

FIG. 24 illustrates a cross-sectional view 2400 of some embodiments corresponding to Action 624. As shown by FIG. 24, a second memory hard mask 2402 is formed over the memory region 108 and a seventh etch is performed into the sacrificial gates 1502 to remove the sacrificial gates 1502 and to form corresponding recesses 2404a-c between the main sidewall structure 144. The second memory hard mask 2402 is, for example, 30-150 A thick and/or is, for example, formed of oxide, titanium nitride, silicon nitride, or an NON film.

Figure 25:
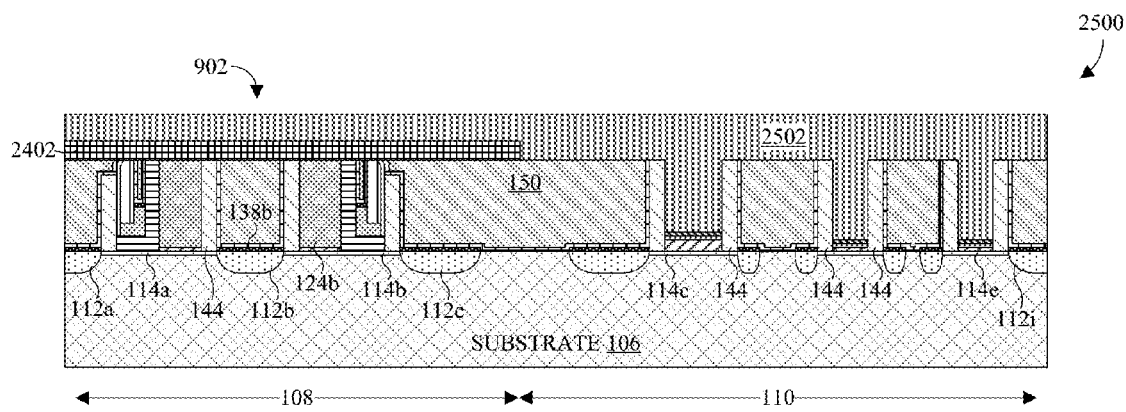

FIG. 25 illustrates a cross-sectional view 2500 of some embodiments corresponding to Action 626. As shown by FIG. 25, a third, metal conductive layer 2502 is formed to fill the recesses 2404.

Figure 26:
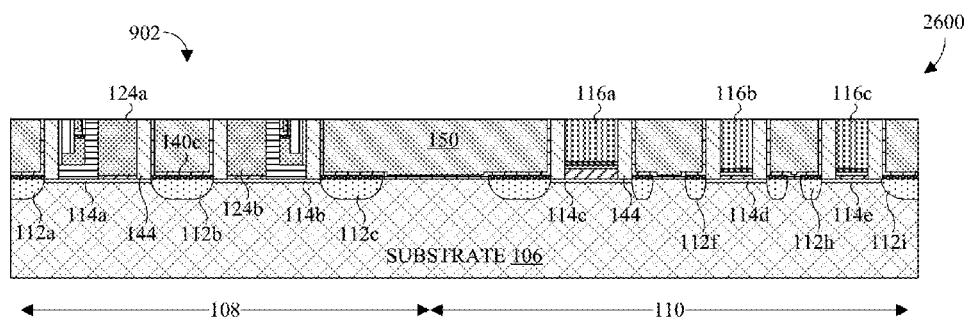

FIG. 26 illustrates a cross-sectional view 2600 of some embodiments corresponding to Action 628. As shown by FIG. 26, a second planarization is performed through the second memory hard mask 2402 and into the metal conductive layer 2502 to top surfaces of the main sidewall structure 144 to form metal gates 116a-c corresponding to the recesses 2404 and having top surfaces coplanar with top surfaces of the select gates 124. In some embodiments, the second planarization is also into the select gates 124, and/or otherwise reduces the height of the select gates 124. Further, in some embodiments, the top surfaces of the metal gates 116 are 350-700 A above the top surface of the semiconductor substrate 106. The second planarization can, for example, be performed using a CMP.

Figure 27:
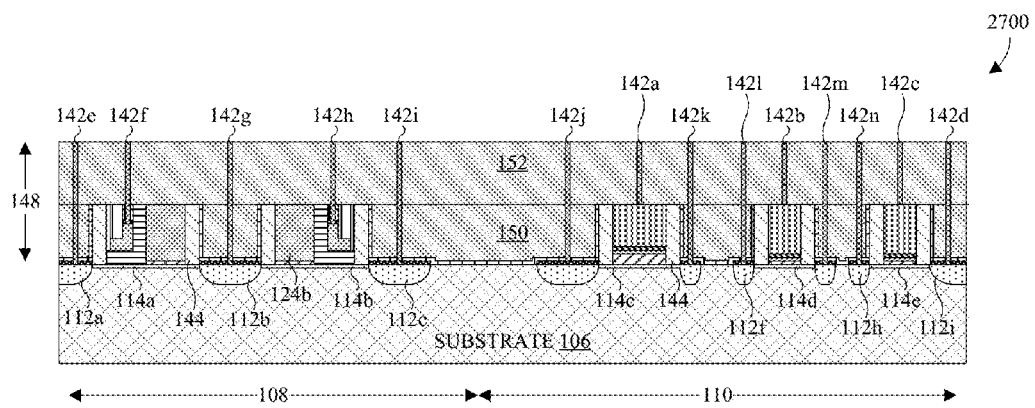

FIG. 27 illustrates a cross-sectional view 2700 of some embodiments corresponding to Actions 630-634. As shown by FIG. 27, an sixth, interlayer dielectric is formed over the top surface of the semiconductor structure to form a second interlayer dielectric substructure 152. The first and second interlayer dielectric substructures 150, 152 collectively form an interlayer dielectric 148. Also formed are conductive contacts 142a-n extending vertically down through the interlayer dielectric 148 to the source/drain and memory contact pads 138, 140 and to the metal gates 116.

With reference to FIGS. 28-49, cross-sectional views of some embodiments of the semiconductor structure at various stages of manufacture are provided to illustrate the expanded method. Although FIGS. 28-49 are described in relation to the expanded method, it will be appreciated that the structures disclosed in FIGS. 28-49 are not limited to the expanded method, but instead may stand alone as structures independent of the expanded method. Similarly, although the expanded method is described in relation to FIGS. 28-49, it will be appreciated that the expanded method is not limited to the structures disclosed in FIGS. 28-49, but instead may stand alone independent of the structures disclosed in FIGS. 28-49.

Figure 28:
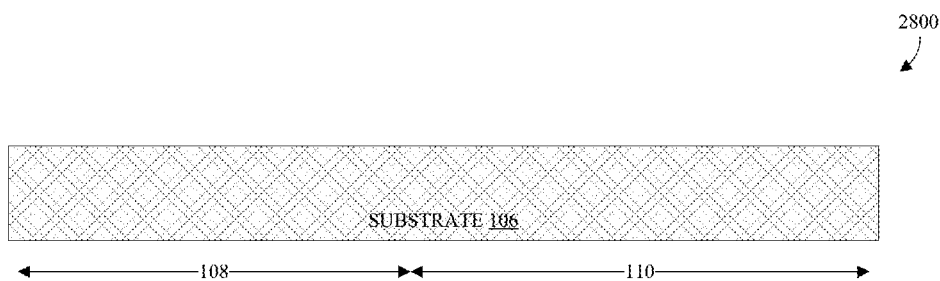
FIGS. 28-49 illustrate a series of cross-sectional views of some embodiments of a semiconductor structure with memory cell devices and high κ, metal gate logic devices, the memory cell devices including silicided structures.

FIG. 28 illustrates a cross-sectional view 2800 of some embodiments corresponding to Action 602. As shown by FIG. 28, a semiconductor substrate 106 is provided. The semiconductor structure includes a memory region 108 and a logic region 110 typically arranged around the memory region 108. The semiconductor substrate 106 is typically planar with a uniform thickness. Further, the semiconductor substrate 106 is, for example, a bulk substrate of silicon, germanium, or group III and group V elements. Alternatively, the semiconductor substrate 106 is, for example, a SOI substrate.

FIGS. 29-38 illustrate cross-sectional views 2900-3800 of some embodiments corresponding to Action 604.

Figure 29:
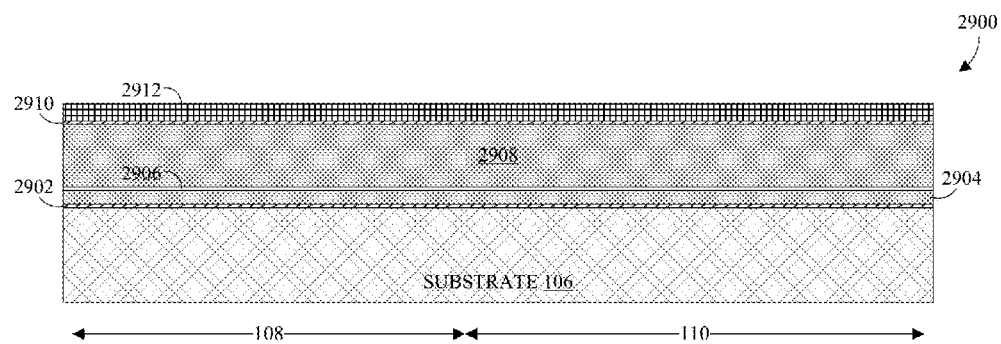

As shown by FIG. 29, a first dielectric layer 2902, a first conductive layer 2904, a second dielectric layer 2906, a second conductive layer 2908, a third dielectric layer 2910, and a hard mask layer 2912 are stacked or formed in that order over a top surface of the semiconductor substrate 106. Each of the layers 2902-2912 typically has a uniform thickness. The first and third dielectric layers 2902, 2910 are, for example, an oxide, such as silicon dioxide. The first and second conductive layers 2904, 2908 are, for example, polysilicon. The hard mask layer is 2912, for example, a nitride or a multilayer NON film. The second dielectric layer 2906 is, for example, an oxide or a multilayer ONO film.

Figure 30:
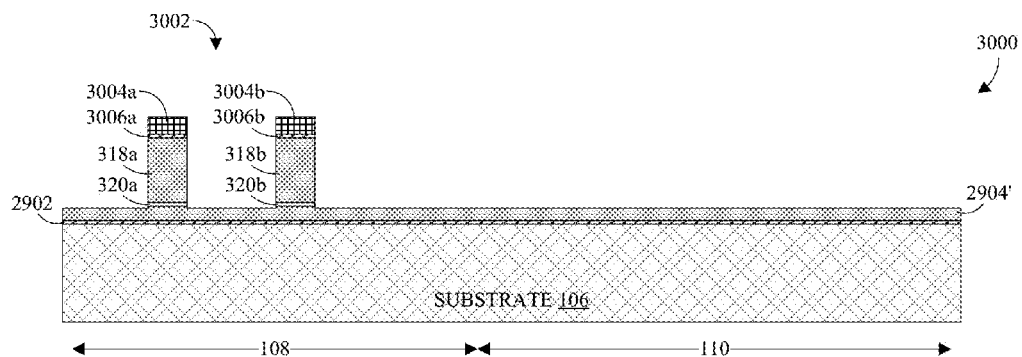

As shown by FIG. 30, a first etch is performed through the second dielectric layer 2906, the second conductive layer 2908, the third dielectric layer 2910, and the hard mask layer 2912, as well as partially into the first conductive layer 2904, to form a pair of spaced control gates 318a, 318b in the memory region 108 of the semiconductor substrate 106. The control gates 318 form a central region 3002 between the control gates 318 and rest upon control gate dielectrics 320a, 320b electrically isolating the control gates 318 from the remaining first conductive layer 2904'. Further, the control gates 318 are masked by memory hard masks 3004a, 3004b electrically isolated from the control gates 318 by memory hard mask dielectrics 3006a, 3006b.

Figure 31:
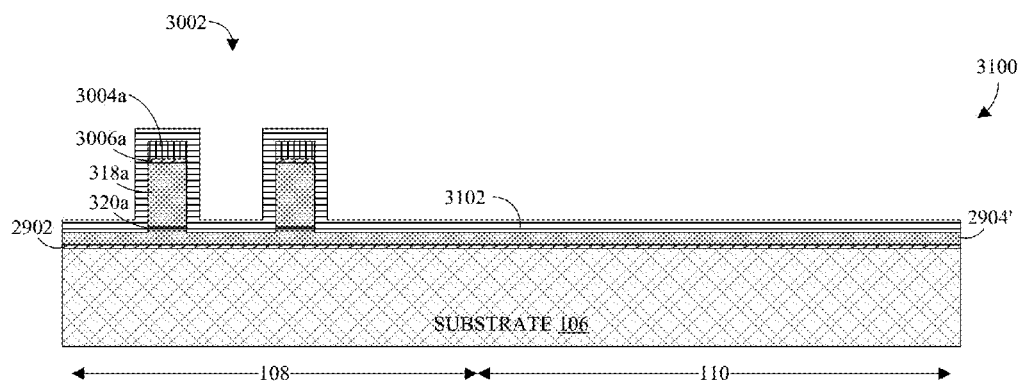

As shown by FIG. 31, a fourth dielectric layer 3102 is conformally formed over the semiconductor structure. The fourth dielectric layer 3102 is conformally formed over top surfaces of the remaining first conductive layer 2904' and the memory hard masks 3004, and along sidewalls of the control gate dielectrics 320, the control gates 318, the memory hard mask dielectrics 3006, the memory hard masks 3004, and the remaining first conductive layer 2904'. The fourth dielectric layer 3102 is, for example, a multilayer charge trapping dielectric, such as an ONO dielectric or an OSiO dielectric.

Figure 32:
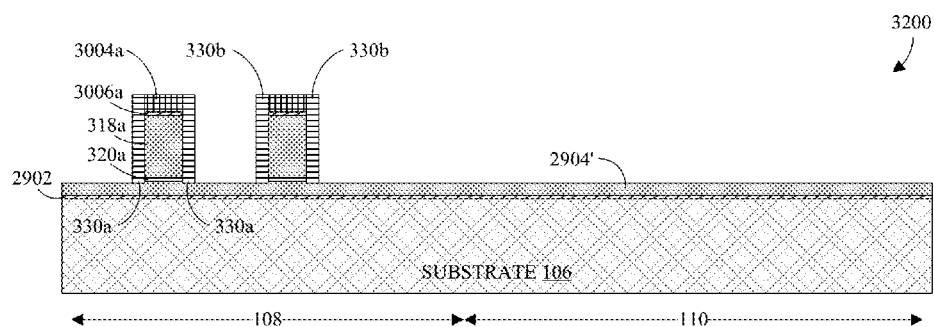

As shown by FIG. 32, a second etch is performed through portions of the fourth dielectric layer 3102 to remove portions of the fourth dielectric layer 3102 that do not line sidewalls of the control gates 318 and to form floating gate spacers 330a, 330b. Typically this is performed by removing the approximate thickness of the fourth dielectric layer 3102 anisotropically in the vertical direction.

Figure 33:
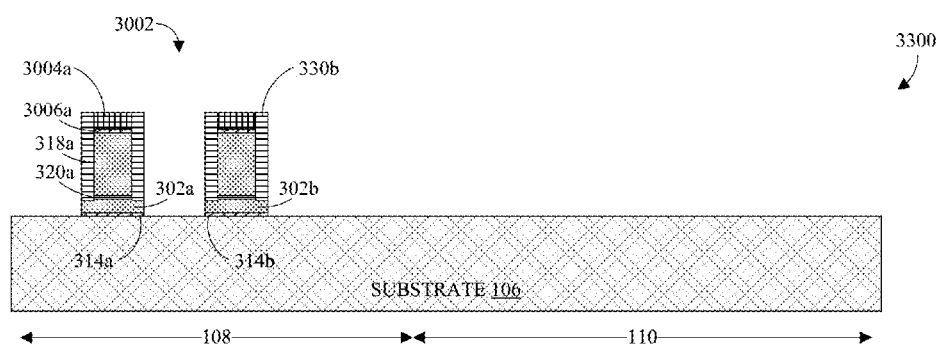

As shown by FIG. 33, a third etch is performed through the remaining first conductive layer 2904' and the first dielectric layer 2902 to remove exposed portions of the remaining first conductive layer 2904' and corresponding portions of the first dielectric layer 2902. Upon completion of the third etch, a pair of floating gates 302a, 302b rest atop floating gate dielectrics 314a, 314b.

Figure 34:
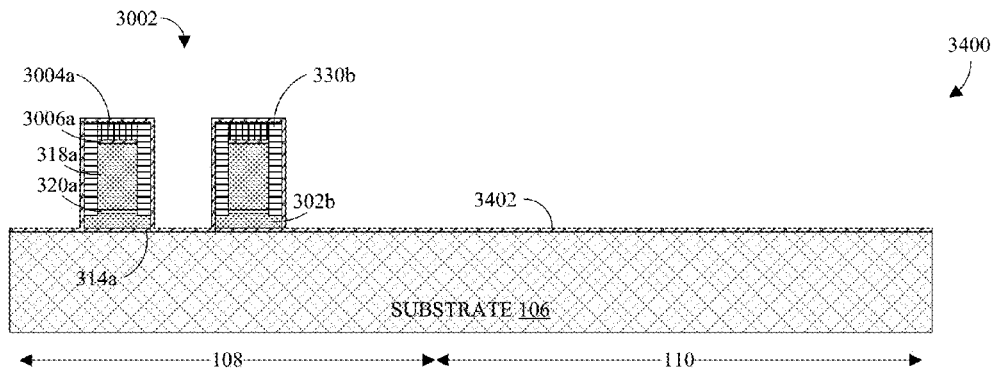

As shown by FIG. 34, a fifth dielectric layer 3402 is conformally formed over the semiconductor substrate 106, the floating gate spacers 330, the top surface of the memory hard masks 3004, and exposed sidewalls of the floating gates 302. Typically, the fourth dielectric layer 3402 is a silicon oxide dielectric, but other types of dielectrics can be used in place of the silicon oxide dielectric. Further, the formation is typically by a high temperature oxide (HTO) deposition.

Figure 35:
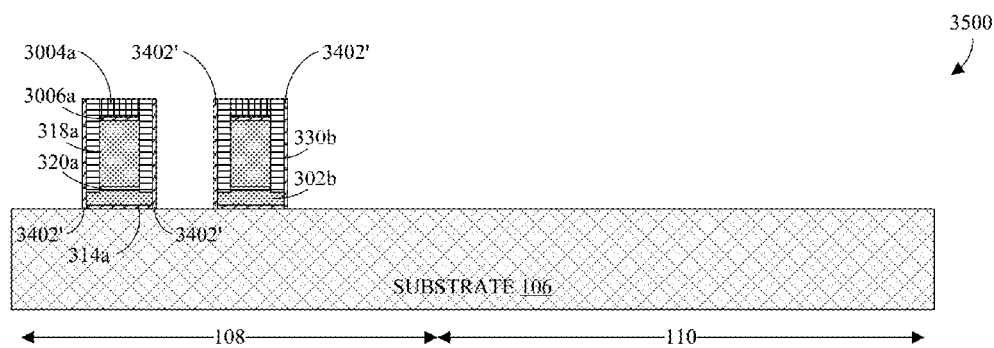

As shown in FIG. 35, a fourth etch is performed through the fifth dielectric layer 3402 to remove portions of the fifth dielectric layer 3402 that cover, line or are otherwise formed on the surface of the semiconductor substrate 106. In some embodiments, the fourth etch further removes portions of the fifth dielectric layer 3402 lining a top surface of the memory hard masks 3004.

Figure 36:
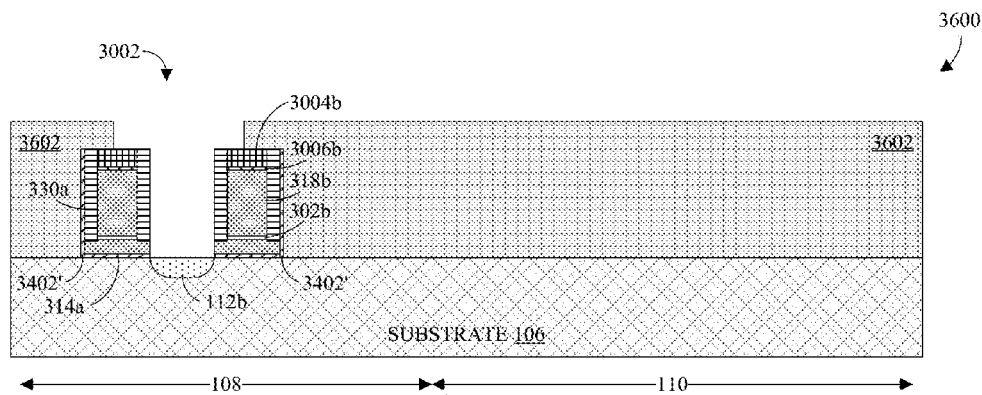

As shown by FIG. 36, a mask 3602 is formed and a fifth etch is performed through portions of the remaining fifth dielectric layer 3402' in the central region 3002 to remove these portions from the central region 3002. Typically, the fifth etch is an isotropic dry etch. Further, a source/drain region 112b is embedded within the surface of the semiconductor substrate 106 between the control gates 318.

Figure 37:
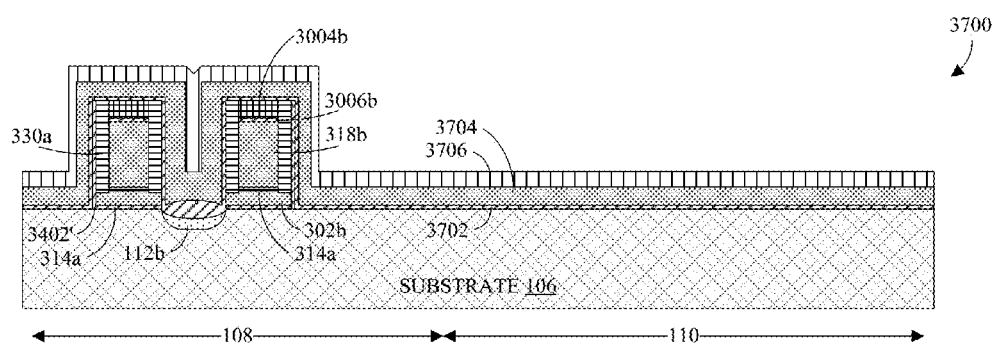

As shown by FIG. 37, a sixth dielectric layer 3702, a third conductive layer 3704, and a seventh dielectric layer 3706 are conformably formed. In some embodiments, the seventh dielectric layer 3706 is omitted. The sixth dielectric layer 3702 is conformally formed over the semiconductor substrate 106, the remaining fifth dielectric layer 3402', the exposed sidewalls of the floating gates 302, the floating gate spacers 330, and the memory hard masks 3004. The third conductive layer 3704 is conformally formed over the sixth dielectric layer 3702, and the seventh dielectric layer 3706 is conformally formed over the third conductive layer 3704. The sixth dielectric layer 3702 is, for example, an oxide, such as silicon dioxide, the third conductive layer 3704 is, for example, polysilicon, and the seventh dielectric layer 3706 is, for example, silicon nitride. In some embodiments, the sixth dielectric layer 3702 is formed by depositing 50 A of oxide by in-situ steam generation, 60 A by HTO deposition, and 50 A by wet oxide deposition.

Figure 38:
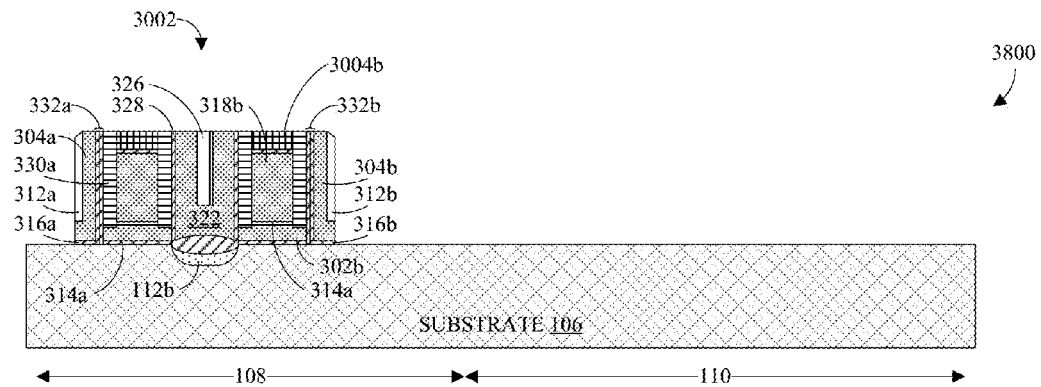

As shown by FIG. 38, a sixth etch is performed through the sixth dielectric layer 3702, the third conductive layer 3704, and the seventh dielectric layer 3706. The sixth etch results in word lines 304a, 304b and word line spacers 312a, 312b formed over word line dielectrics 316a, 316b. Further, the sixth etch results in a dielectric liner 328 lining the central region 3002 and thin floating gate sidewall structures 332a, 332b arranged between the floating gate spacers 330 and the word lines 304. Even more, the sixth etch results in an erase gate 322 and an erase gate spacer 322.

Figure 39:
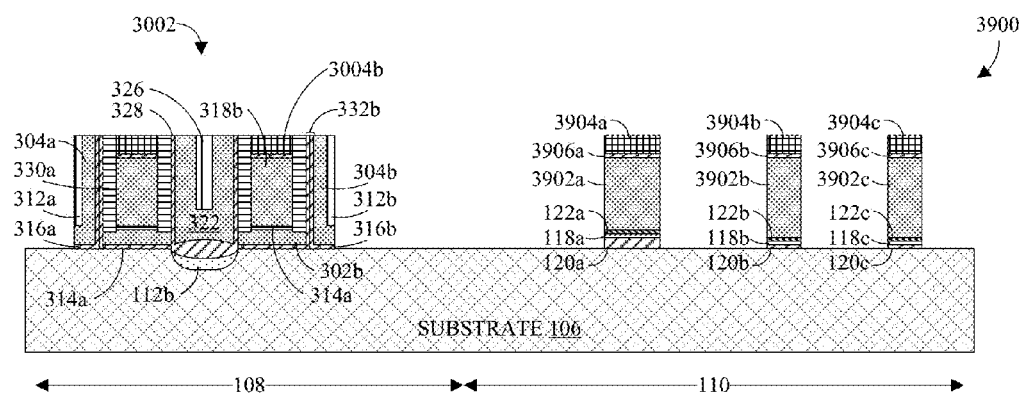

FIG. 39 illustrates a cross-sectional view 3900 of some embodiments corresponding to Action 606. As shown by FIG. 39, a trio of sacrificial gates 3902a-c is formed over corresponding high κ dielectrics 118a-c in the logic region 110 of the semiconductor substrate 106. The sacrificial gates 3902 are masked by logic hard masks 3904a-c electrically isolated from the sacrificial gates 3902 by logic hard mask dielectrics 3906a-c. Further, metal gate dielectrics 120a-c corresponding to the sacrificial gates 3902 are formed between the semiconductor substrate 106 and the high κ dielectrics 118, and etch stops 122a-c corresponding to the sacrificial gates 3902 are formed between the sacrificial gate 3902 and the high κ dielectrics 118. For high voltage applications, the metal gate dielectric 120 is typically thicker than it would otherwise be. Even more, logic hard masks 3904a-c are formed over corresponding sacrificial gates 3902. The sacrificial gates 3902 are, for example, polysilicon, the metal gate and logic hard mask dielectrics 120, 3906 are, for example, an oxide, such as silicon dioxide, the etch stops 122 are, for example, silicon nitride, the high κ dielectrics 118 are, for example, $HfO_2$, $AlO_3$, or $Ta_2O_5$, and the logic hard masks 3904 are, for example, an oxide, a silicon nitride or a multilayer NON film. In some embodiments, the logic hard masks 3904 have a thickness of 50-1100 A.

Figure 40:
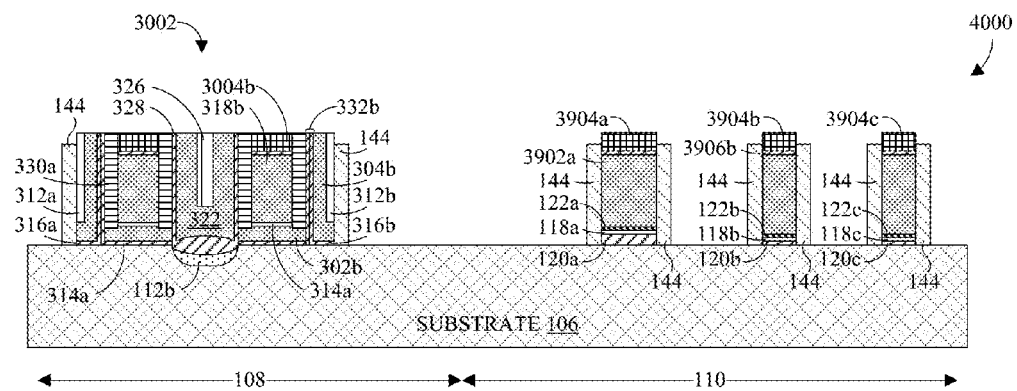

FIG. 40 illustrates a cross-sectional view 4000 of some embodiments corresponding to Action 608. As shown by FIG. 40, a main sidewall structure 144 is formed along sidewalls of the word lines 304 and the word line spacers 312. Further, the main sidewall structure 144 is formed along opposing sidewalls of the sacrificial gates 3902. In some embodiments, a RPO layer is also formed over the main sidewall structure 144. The main sidewall structure 144 can be formed by, for example, conformally forming an intermediate dielectric layer and selectively etching the intermediate dielectric layer to form the main sidewall structure 144. The main sidewall structure 144 is, for example, a dielectric, such as silicon nitride.

Figure 41:
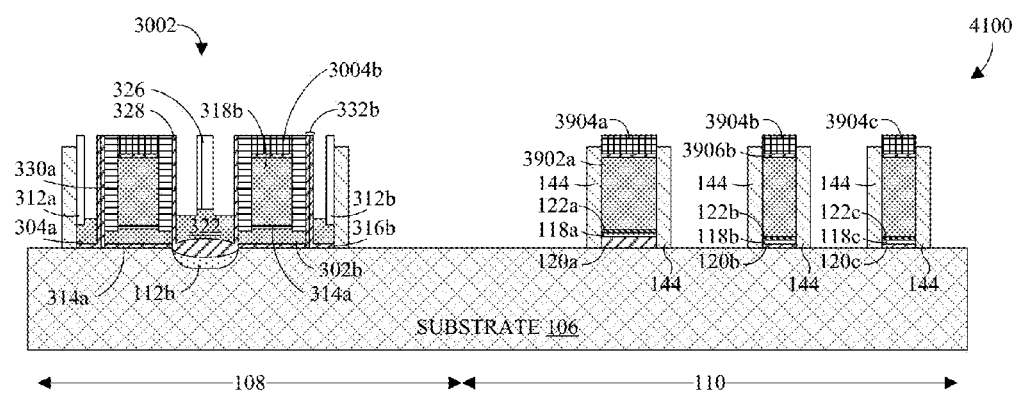

FIG. 41 illustrates a cross-sectional view 4100 of some embodiments corresponding to Action 610. As shown by FIG. 41, a seventh etch is performed partially into the word lines 304 to recess upper top surfaces of the word lines 304 relative to top surfaces of neighboring dielectric regions (e.g., the word line spacer 312) and/or relative to top surfaces of the sacrificial and/or control gates 318, 3902. In some embodiments, the seventh etch recesses the top surfaces of the word lines 304 about 10-1000 A below top surfaces of neighboring dielectric regions and/or top surfaces of the sacrificial and/or control gates 318, 3902. The seventh etch includes a BARC etch back followed by a highly selective etch of the word lines 304, typically formed of polysilicon. The BARC etch back etches back exposed portions of the memory region 108 using, for example, a chemistry comprised of one or more of $O_2$, $Cl_2$, or $CF_4$. The highly selective etch preferentially etches the word lines 304 using, for example, a dry etch chemistry comprised of $Cl_2$, $BCl_3$, Ar, or a fluorine gas. Alternatively, the highly selective etch preferentially etches the word lines 304 using, for example, a wet etch chemistry comprised of an alkali solution.

Figure 42:
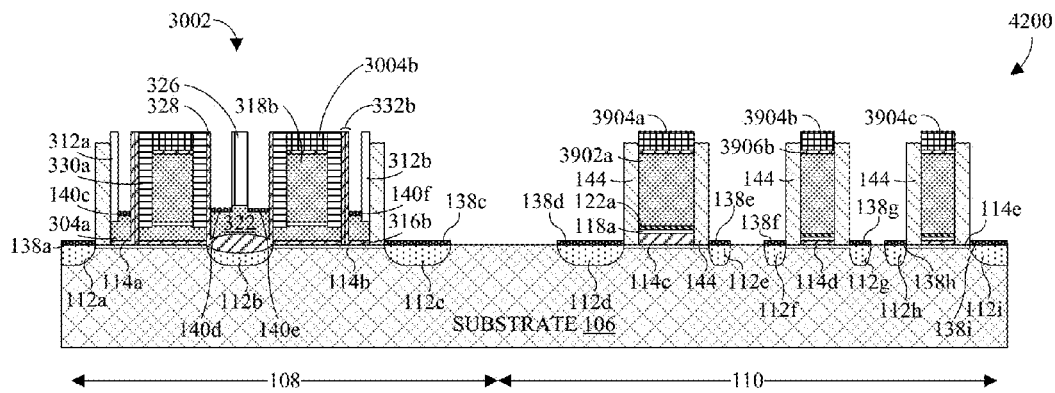

FIG. 42 illustrates a cross-sectional view 4200 of some embodiments corresponding to Actions 612 and 614. As shown by FIG. 42, source and drain regions 112a-i are embedded within the semiconductor substrate 106 to form channel regions 114a-e, and a silicide layer is formed over the source and drain regions 112 to form source/drain silicide contact pads 138a-i and memory contact pads 140c-f. In some embodiments, the silicide layer has a thickness of about 50-200 A. The silicide layer is, for example, nickel silicide, cobalt silicide, or titanium silicide.

Figure 43:
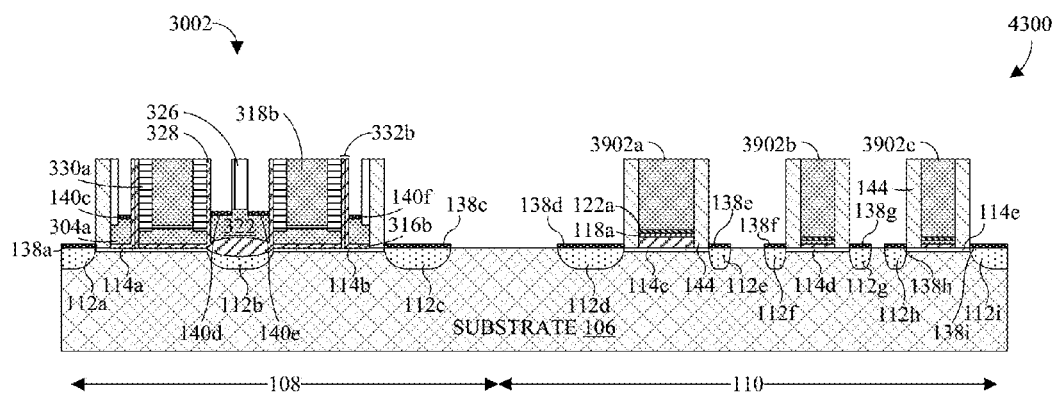

FIG. 43 illustrates a cross-sectional view 4300 of some embodiments corresponding to Action 616. As shown by FIG. 43, an eighth etch is performed to remove the memory and logic hard masks 3004, 3904, as well as the memory and logic hard mask dielectrics 3006, 3906. The eighth etch further stops on the sacrificial gates 3902 and the control gates 318, while minimally etching back the main sidewall structure 144, dielectric liner 328, word line spacer 312, and the thin floating gate sidewall structure 332. The etch back is, for example, a BARC etch back.

Figure 44:
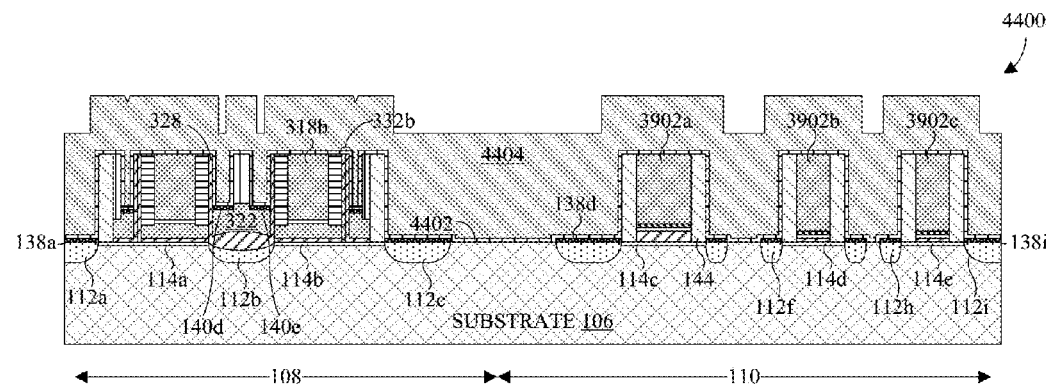

FIG. 44 illustrates a cross-sectional view 4400 of some embodiments corresponding to Action 618 and 620. As shown by FIG. 44, a contact etch stop layer 4402 is conformably formed over the semiconductor structure. The contact etch stop layer 4402 runs along top surfaces of the contact pads 138, 140 and the control and sacrificial gates 318, 3902, as well as along sidewalls of the main sidewall structures 144. Also shown, an eighth, interlayer dielectric layer 4404 is formed over the contact etch stop layer 44002. The contact etch stop layer 4402 is, for example, silicon nitride, and the interlayer dielectric layer 4404 is, for example, an oxide, such as silicon dioxide.

Figure 45:
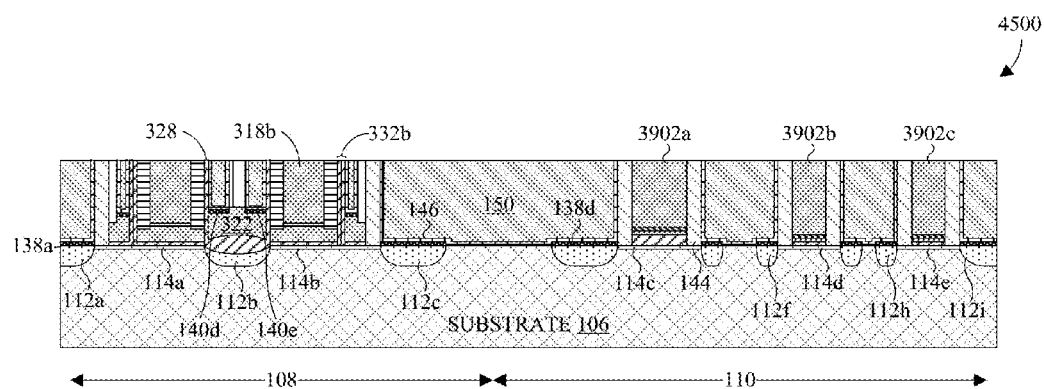

FIG. 45 illustrates a cross-sectional view 4500 of some embodiments corresponding to Action 622. As shown by FIG. 45, a first planarization is performed into the eighth, interlayer dielectric layer 4404, through the contact etch stop layer 4402, and stops on the control gates 318. This forms a contact etch stop 146 and a first interlayer dielectric substructure 150. In some embodiments, the first planarization is also into the control gates 318 and the sacrificial gates 3902 to co-planarize top surfaces of these gates 318, 3902 and/or otherwise reduce the height of these gates 318, 3902. The first planarization can, for example, be performed using a chemical machine polish (CMP).

Figure 46:
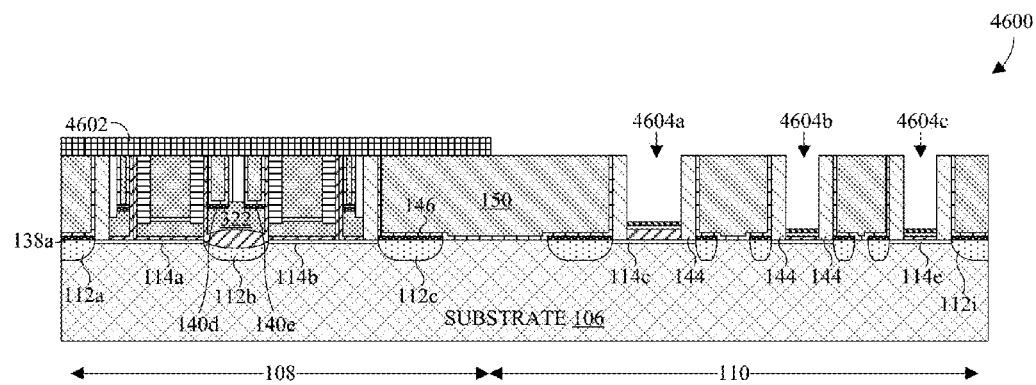

FIG. 46 illustrates a cross-sectional view 4600 of some embodiments corresponding to Action 624. As shown by FIG. 46, a second memory hard mask 4602 is formed over the memory region 108 and an ninth etch is performed into the sacrificial gates 3902 to remove the sacrificial gates 3902 and to form corresponding recesses 4602*a-c* between the main sidewall structure 144. The second memory hard mask 4602 is, for example, 30-150 A thick and/or is, for example, formed of oxide, titanium nitride, silicon nitride, or an NON film.

Figure 47:
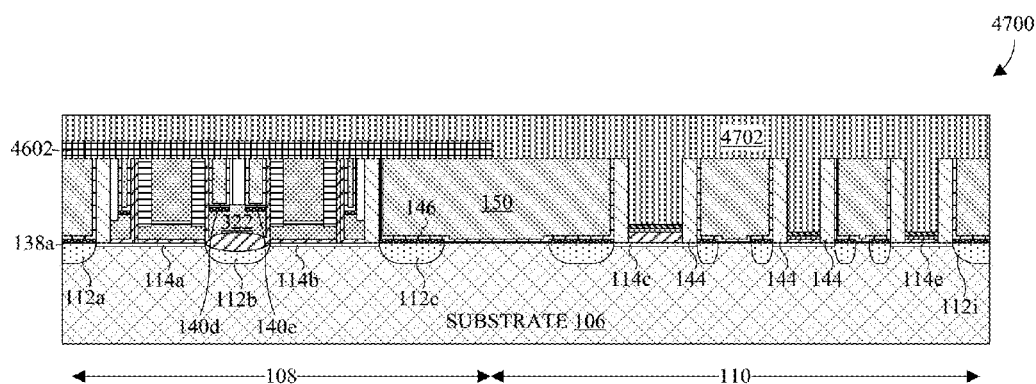

FIG. 47 illustrates a cross-sectional view 4700 of some embodiments corresponding to Action 626. As shown by FIG. 47, a fourth, metal conductive layer 4702 is formed to fill the recesses 4602.

Figure 48:
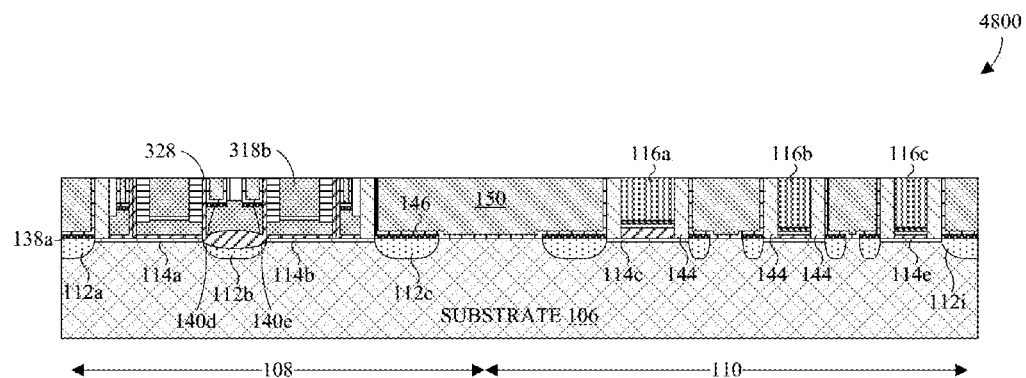

FIG. 48 illustrates a cross-sectional view 4800 of some embodiments corresponding to Action 628. As shown by FIG. 48, a second planarization is performed through the second memory hard mask 4602 and into the metal conductive layer 4702 to top surfaces of the main sidewall structure 144 to form metal gates 116*a-c* corresponding to the recesses 4602 and having top surfaces coplanar with top surfaces of the control gates 318. In some embodiments, the second planarization is also into the control gates 318, and/or otherwise reduces the height of the control gates 318. Further, in some embodiments, the top surfaces of the metal gates 116 are 350-700 A above the top surface of the semiconductor substrate 106. The second planarization can, for example, be performed using a CMP.

Figure 49:
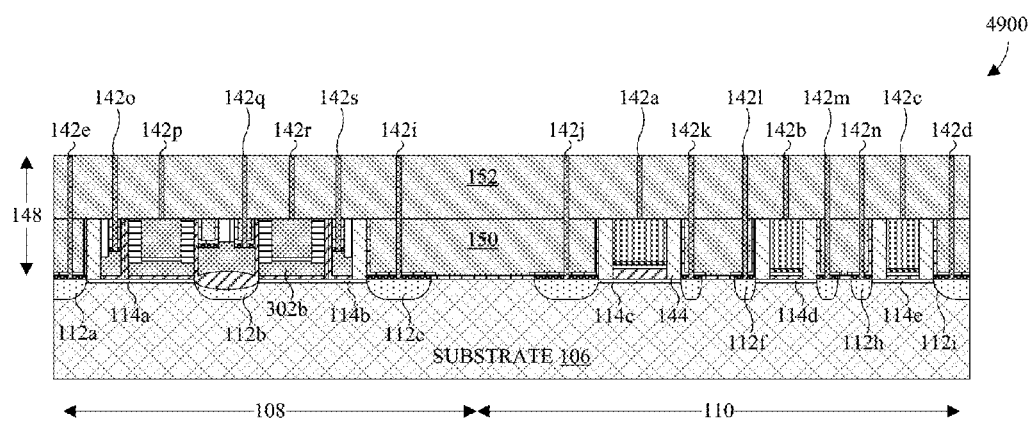

FIG. 49 illustrates a cross-sectional view 4900 of some embodiments corresponding to Actions 630-634. As shown by FIG. 49, an ninth, interlayer dielectric is formed over the top surface of the semiconductor structure to form a second interlayer dielectric substructure 152. The first and second interlayer dielectric substructures 150, 152 collectively form an interlayer dielectric 148. Also formed are conductive contacts 142*a-e*, 142*i-s* extending vertically down through the interlayer dielectric 148 to the source/drain and memory contact pads 138, 140 and to the metal gates 116.

Thus, as can be appreciated from above, the present disclosure provides an integrated circuit for an embedded flash memory device. A semiconductor substrate includes a memory region and a logic region adjacent to the memory region. A logic device is arranged over the logic region and includes a metal gate separated from the semiconductor substrate by a material having a dielectric constant exceeding 3.9. A flash memory cell device is arranged over the memory region. The flash memory cell device includes a first memory cell gate, a second memory cell gate, and a dielectric region arranged between neighboring sidewalls of the first and second memory cell gates. A silicide contact pad is arranged over a top surface of the first memory cell gate, wherein the silicide contact pad is recessed relative to top surfaces of the dielectric region, the second memory cell gate and the metal gate.

In other embodiments, the present disclosure provides a method for manufacturing an embedded flash memory device. A memory cell device is formed over a memory region of a semiconductor substrate. The memory cell device includes a first memory cell gate, a second memory cell gate, and a dielectric region arranged between neighboring sidewalls of the first and second memory cell gates. A logic device is formed over a logic region of the semiconductor substrate. The logic device has a sacrificial gate separated from the semiconductor substrate by a material with a dielectric constant exceeding 3.9. A top surface of the first memory cell gate is recessed relative to top surfaces of the dielectric region, the second memory cell gate and the sacrificial gate. A silicide contact pad is formed over the recessed top surface of the first memory cell gate. The sacrificial gate is replaced with a metal gate.

In yet other embodiments, the present disclosure provides an integrated circuit for an embedded flash memory device. A semiconductor substrate includes a memory region and a logic region adjacent to the memory region. The memory region includes a common source/drain region and a pair of individual source/drain regions arranged on opposite sides of the common source/drain region. A logic device is arranged over the logic region and includes a metal gate separated from the semiconductor substrate by a material having a dielectric constant exceeding 3.9. A pair of flash memory cell devices is arranged over the memory region. Each flash memory cell device corresponds to one of the individual source/drain regions. Further, each flash memory cell device and includes a select gate and a memory gates arranged between the common source/drain region and the corresponding individual source/drain region, and a charge trapping dielectric arranged between neighboring sidewalls of the memory and select gates, and arranged under the memory gate. Silicide contact pads are respectively arranged over top surfaces of the memory gates. Top surfaces of the silicide contact pads are recessed relative to top surfaces of the charge trapping dielectrics, the select gates and the metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit for an embedded flash memory device, said integrated circuit comprising:
   a semiconductor substrate including a memory region and a logic region adjacent to the memory region;
   a logic device arranged over the logic region and including a metal gate separated from the semiconductor substrate by a material having a dielectric constant exceeding 3.9;
   a flash memory cell device arranged over the memory region, wherein the flash memory cell device includes a first memory cell gate, a second memory cell gate, and a dielectric region arranged between neighboring sidewalls of the first and second memory cell gates, and wherein a top surface of the first memory cell gate is recessed below a top surface of the metal gate; and
   a silicide contact pad arranged on the first memory cell gate, wherein the silicide contact pad is recessed relative to top surfaces of the dielectric region, the second memory cell gate, and the metal gate.

2. The integrated circuit according to claim 1, wherein the first memory cell gate is a memory gate, the second memory cell gate is a select gate, and the dielectric region includes a charge trapping dielectric arranged under the memory gate.

3. The integrated circuit according to claim 1, wherein the first memory cell gate is a word line or an erase gate, and the second memory cell gate is a control gate arranged over a floating gate.

4. The integrated circuit according to claim 1, wherein the flash memory cell device includes:
   a floating gate;
   an erase gate and a word line spaced from the floating gate on opposite sides of the floating gate;
   a control gate arranged over the floating gate; and
   a floating gate spacer arranged between neighboring sidewalls of the control gate, the word line, and the erase gate;
   wherein the first memory cell gate is the word line or the erase gate, the second memory cell gate is the control gate, and the dielectric region includes the floating gate spacer.

5. The integrated circuit according to claim 1, further including:
   a first interlayer dielectric substructure arranged over the silicide contact pad, wherein a top surface of the first interlayer dielectric substructure is coplanar with top surfaces of the metal gate and the second memory cell gate.

6. The integrated circuit according to claim 5, further including:
   a contact etch stop arranged over the silicide contact pad between the first interlayer dielectric substructure and the silicide contact pad.

7. The integrated circuit according to claim 5, further including:
   a second interlayer dielectric substructure independent of the first interlayer dielectric substructure and arranged over the first interlayer dielectric substructure, wherein a bottom surface of the second interlayer dielectric substructure is coplanar with the top surfaces of the metal gate and the second memory cell gate, and wherein the first and second interlayer dielectric substructures collectively cover the logic and memory regions.

8. The integrated circuit according to claim 1, further including:
   a conductive contact extending vertically down to the silicide contact pad.

9. The integrated circuit according to claim 1, wherein the first memory cell gate includes a spacer arranged over an upper surface of the first memory cell gate, wherein the upper surface of the first memory cell gate is recessed below the top surface of the first memory cell gate.

10. An integrated circuit for an embedded flash memory device, said integrated circuit comprising:
    a semiconductor substrate including a memory region and a logic region adjacent to the memory region, the memory region including a common source/drain region and a pair of individual source/drain regions arranged on opposite sides of the common source/drain region;
    a logic device arranged over the logic region and including a metal gate separated from the semiconductor substrate by a material having a dielectric constant exceeding 3.9; and
    a pair of flash memory cell devices arranged over the memory region, wherein each flash memory cell device corresponds to one of the individual source/drain regions and includes:
        a select gate and a memory gate arranged between the common source/drain region and the corresponding individual source/drain region;
        a charge trapping dielectric arranged between neighboring sidewalls of the memory and select gates, and arranged under the memory gate; and
        a silicide contact pad arranged over a top surface of the memory gate, wherein a top surface of the silicide contact pad is recessed relative to top surfaces of the charge trapping dielectric, the select gate, and the metal gate.

11. The integrated circuit according to claim 10, wherein each flash memory cell device further comprises:
    a first interlayer dielectric substructure arranged over the silicide contact pad, wherein a top surface of the first interlayer dielectric substructure is coplanar with top surfaces of the metal gate and the select gate.

12. The integrated circuit according to claim 11, further comprising:
    a contact etch stop arranged over the silicide contact pad between the first interlayer dielectric substructure and the silicide contact pad.

13. The integrated circuit according to claim 11, further comprising:
    a second interlayer dielectric substructure independent of the first interlayer dielectric substructure and arranged over the first interlayer dielectric substructure, wherein a bottom surface of the second interlayer dielectric substructure is coplanar with top surfaces of the metal gate and the select gate, and wherein the first and second interlayer dielectric substructures collectively cover the logic and memory regions.

14. The integrated circuit according to claim 10, wherein each flash memory cell device further comprises a spacer arranged over an upper surface of the memory gate, wherein the upper surface of the memory gate is laterally adjacent to the top surface of the memory gate and is recessed below the top surface of the memory gate.

15. An integrated circuit comprising:
    a logic device arranged on a semiconductor substrate, wherein the logic device comprises a metal gate arranged over and spaced from the semiconductor substrate;

a memory cell device arranged on the semiconductor substrate and laterally spaced from the logic device, wherein the memory cell device includes a first memory cell gate laterally spaced from a second memory cell gate; and a silicide contact pad arranged on a top surface of the first memory cell gate and recessed below substantially coplanar top surfaces of the metal and second memory cell gates.

16. The integrated circuit according to claim 15, wherein the second memory cell gate is a select gate.

17. The integrated circuit according to claim 16, further comprising:
a charge trapping dielectric layer arrange between neighboring sidewalls of the first and second memory cell gates, and further arranged under the first memory cell gate.

18. The integrated circuit according to claim 15, wherein the first memory cell gate is a word line or an erase gate, and wherein the second memory cell gate is a control gate arranged over a floating gate.

19. The integrated circuit according to claim 15, wherein the first memory cell gate comprises an upper surface that is laterally adjacent to the top surface of the first memory cell gate and that is recessed below the top surface of the first memory cell gate.

20. The integrated circuit according to claim 15, further comprising:
an interlayer dielectric structure arranged over the silicide contact pad, wherein a top surface of the interlayer dielectric structure is coplanar with the top surfaces of the metal and second memory cell gates; and a contact etch stop arranged over the silicide contact pad between the interlayer dielectric structure and the silicide contact pad.

* * * * *